United States Patent
Jung et al.

(10) Patent No.: US 10,921,847 B2
(45) Date of Patent: Feb. 16, 2021

(54) CLOCK GENERATOR FOR ADJUSTING JITTER CHARACTERISTICS AND OPERATION POWER, SEMICONDUCTOR DEVICE INCLUDING THE CLOCK GENERATOR, AND OPERATING METHOD OF THE CLOCK GENERATOR

(71) Applicant: SAMSUNG ELECTRONICS CO., LTD., Suwon-si (KR)

(72) Inventors: Sangdon Jung, Yongin-si (KR); Jaehong Jung, Bucheon-si (KR); Seunghyun Oh, Seoul (KR); Kyungmin Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/724,754

(22) Filed: Dec. 23, 2019

(65) Prior Publication Data
US 2020/0401178 A1    Dec. 24, 2020

(30) Foreign Application Priority Data
Jun. 18, 2019    (KR) .................. 10-2019-0072420

(51) Int. Cl.
*G06F 1/08* (2006.01)
*H03L 7/097* (2006.01)
*H03L 7/08* (2006.01)

(52) U.S. Cl.
CPC .............. *G06F 1/08* (2013.01); *H03L 7/0802* (2013.01); *H03L 7/097* (2013.01)

(58) Field of Classification Search
CPC ... G06F 1/04; G06F 1/08; G05F 1/561; H03L 7/0802; H03L 7/081; H03L 7/0814;
(Continued)

(56) References Cited

U.S. PATENT DOCUMENTS

| 5,373,257 A | * | 12/1994 | Shimoda | ................. H03L 7/093 331/17 |
| 5,696,468 A | * | 12/1997 | Nise | ........................ H03L 7/099 327/156 |

(Continued)

FOREIGN PATENT DOCUMENTS

| JP | 2004-112157 A | 4/2004 |
| JP | 2011-182459 A | 9/2011 |

OTHER PUBLICATIONS

Abidi, "Phase Noise and Jitter in CMOS Ring Oscillators", IEEE Journal of Solid-State Circuits, vol. 41, No. 8, Aug. 2006, pp. 1803-1816, 14 pages total.

*Primary Examiner* — An T Luu
(74) *Attorney, Agent, or Firm* — Sughrue Mion, PLLC

(57) ABSTRACT

The clock generator is provided and includes a phase detector, a voltage generator, a voltage-to-current converter, and an oscillation circuit. The voltage generator generates a control voltage. The voltage-to-current converter converts the control voltage into an internal current having a level based on a resistance value of a resistor circuit, the resistance value set based on first control information. The oscillation circuit generates a output clock having a frequency based on the level of the internal current and a capacitance value of a capacitor circuit, the capacitance value set based on second control information. The clock generator maintains a frequency value and varies jitter characteristics of the output clock in response to the first control information and the second control information.

17 Claims, 15 Drawing Sheets

(58) Field of Classification Search
CPC ....... H03L 7/0816; H03L 7/093; H03L 7/099; H03L 7/10; H03L 7/102; H03L 7/103; H03L 7/104
See application file for complete search history.

(56) References Cited

U.S. PATENT DOCUMENTS

| | | | |
|---|---|---|---|
| 6,683,502 B1 * | 1/2004 | Groen | H03L 7/0891 |
| | | | 331/16 |
| 7,068,111 B2 | 6/2006 | Lee | |
| 7,230,490 B2 * | 6/2007 | Dahlin | G05F 3/205 |
| | | | 330/283 |
| 7,696,831 B2 | 4/2010 | Song et al. | |
| 8,073,416 B2 | 12/2011 | Sun et al. | |
| 8,437,721 B2 | 5/2013 | Zeng et al. | |
| 9,344,100 B2 | 5/2016 | Liu et al. | |
| 10,284,205 B2 * | 5/2019 | Sinha | H03L 7/097 |
| 2008/0238560 A1 * | 10/2008 | Shibata | H03B 5/1228 |
| | | | 331/132 |

\* cited by examiner

CLOCK GENERATOR FOR ADJUSTING JITTER CHARACTERISTICS AND OPERATION POWER, SEMICONDUCTOR DEVICE INCLUDING THE CLOCK GENERATOR, AND OPERATING METHOD OF THE CLOCK GENERATOR

CROSS-REFERENCE TO RELATED APPLICATION

This application claims priority from Korean Patent Application No. 10-2019-0072420, filed on Jun. 18, 2019, in the Korean Intellectual Property Office, the disclosure of which is incorporated by reference herein in its entirety.

BACKGROUND

1. Field

The present disclosure relates to a clock generator and a semiconductor device including the same, and more particularly, to a clock generator for adjusting jitter characteristics and operation power, a semiconductor device including the clock generator, and an operating method of the clock generator.

2. Description of Related Art

An operation of a digital block for processing a digital signal may be synchronized with a clock signal. For example, an integrated circuit needs clock signals having various dynamic frequencies for processing such as clocking of a data converter and the digital block, and to this end, a plurality of clock generators may be provided in the integrated circuit. Since the plurality of clock generators are provided in the integrated circuit, an area of the integrated circuit may be increased, and moreover, power consumption may increase.

A single clock generator may be provided in the integrated circuit, and clock signals having various frequencies may be generated by using the single clock generator. This may reduce an area and power consumption. However, there is a problem where the jitter and power consumption of the clock generator have to be designed for the strictest jitter specification, and there is a limit to decreasing undesired power consumption.

SUMMARY

It is an aspect to provide a clock generator for providing clock signals having various frequencies and adjusting a jitter characteristic and operation power, a semiconductor device including the clock generator, and an operating method of the clock generator.

According to an aspect of an example embodiment, there is provided a clock generator including a phase detector configured to detect a phase difference between an input clock and a signal obtained by dividing an output clock, a voltage generator configured to generate a control voltage having a level based on the phase difference, a voltage-to-current converter including a resistor circuit including a plurality of resistors, the voltage-to-current converter converting the control voltage into an internal current having a level based on a resistance value, set based on first control information, of the resistor circuit, and an oscillation circuit including a capacitor circuit including a plurality of capacitors, the oscillation circuit generating the output clock having a frequency based on the level of the internal current and a capacitance value, set based on second control information, of the capacitor circuit, wherein the clock generator is configured to maintain a frequency value and vary a jitter characteristic of the output clock in response to the first control information and the second control information.

According to another aspect of an example embodiment, there is provided a semiconductor circuit including a clock generator configured to receive an input clock to generate an output clock having a target frequency; and a control logic configured to output control information for controlling a jitter characteristic of the output clock of the clock generator, wherein the clock generator comprises a voltage controlled oscillator configured to generate the output clock having a frequency based on a control voltage generated based on a phase difference between the input clock and a signal obtained by dividing the output clock, and when the control information having a first value is received, the voltage controlled oscillator is configured to decrease a jitter of the output clock having the target frequency, and when the control information having a second value is received, the voltage controlled oscillator is configured to increase the jitter of the output clock having the target frequency.

According to another aspect of an example embodiment, there is provided an operating method of a clock generator, the operating method including decreasing a level of the internal current provided to the oscillation circuit in response to receiving control information having a first value, decreasing a capacitance value of a capacitor circuit of the oscillation circuit in response to receiving the control information having the first value to output an output clock having a first frequency, increasing the level of the internal current provided to the oscillation circuit in response to receiving the control information having a second value, and increasing the capacitance value in response to receiving the control information having the second value to maintain a frequency of the output clock as the first frequency, wherein a jitter of the output clock of when the control information has the first value is greater than a jitter of the output clock of when the control information has the second value.

According to another aspect of an example embodiment, there is provided a clock generator including a voltage generator configured to generate a control voltage having a level based on a phase difference between an input clock and a signal obtained by dividing an output clock; and a voltage controlled oscillator comprising a voltage-to-current converter configured to receive the control voltage and convert the control voltage into a current on the basis of a resistance value of a resistor circuit comprising a plurality of resistors, and an oscillation circuit configured to generate the output clock on the basis of a level of the current received from the voltage-to-current converter, wherein the oscillation circuit comprises one or more delay cells each comprising a load, the one or more delay cells receiving the current, and a size of the load of each of the one or more delay cells is adjusted based on a level of the current.

According to another aspect of an example embodiment, there is provided a system on chip including a clock generator configured to generate a clock signal; and a plurality of circuit blocks configured to receive the clock signal from the clock generator, wherein the clock generator is configured to, in a first operation mode of the system on chip, provide a first circuit block of the plurality of circuit blocks with the clock signal having a first jitter characteristic and generated with a first power consumption, and wherein the clock generator is configured to, when the first operation mode is changed to a second operation mode, provide the first circuit block with the clock signal having a second jitter characteristic and generated with a second power consumption without releasing a locking state of the clock signal.

BRIEF DESCRIPTION OF THE DRAWINGS

Embodiments will be more clearly understood from the following detailed description taken in conjunction with the accompanying drawings in which.

DETAILED DESCRIPTION

Hereinafter, embodiments will be described in detail with reference to the accompanying drawings.

Figure 1:
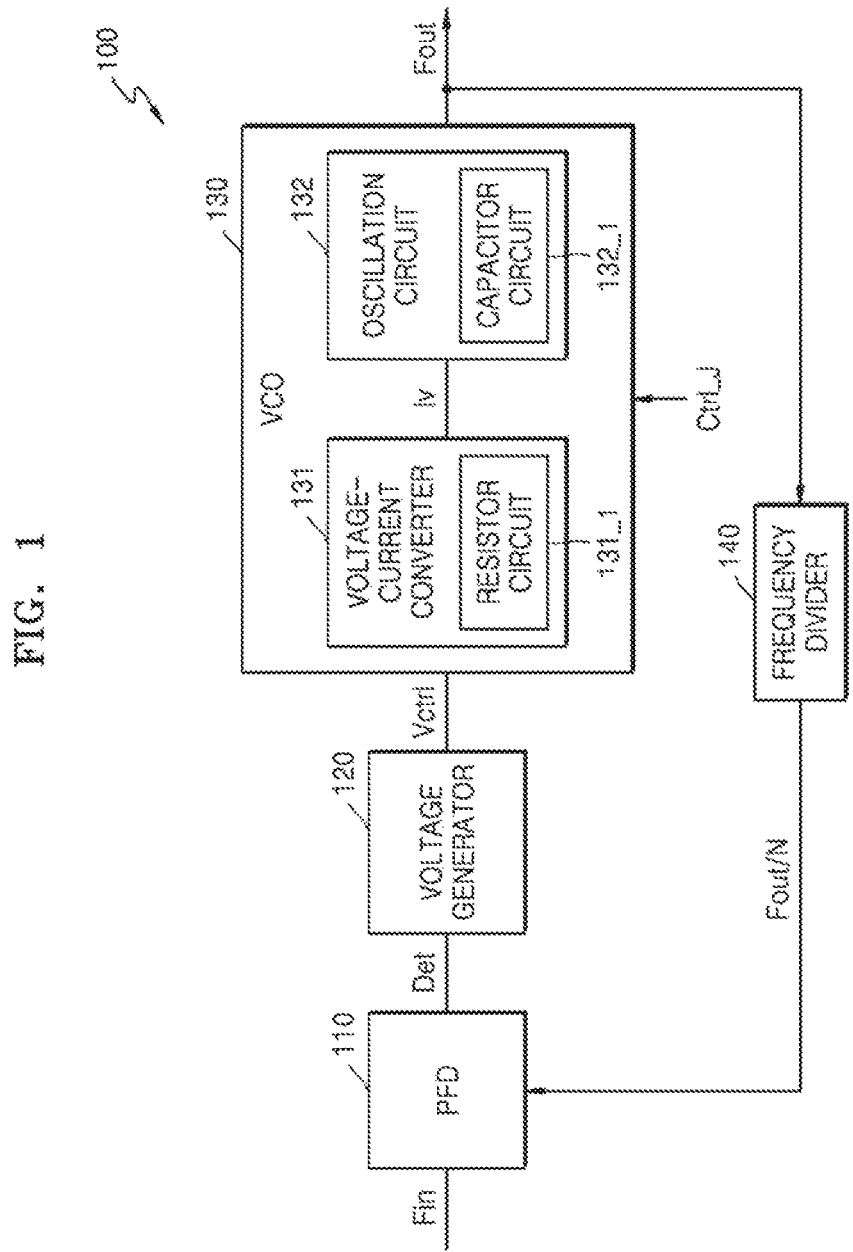
FIG. 1 is a block diagram illustrating a clock generator according to an example embodiment.

FIG. 1 is a block diagram illustrating a clock generator 100 according to an example embodiment.

Referring to FIG. 1, the clock generator 100 may receive an input clock Fin to generate an output clock Fout having a certain frequency. As an implementation example, the clock generator 100 may include a phase-locked loop (PLL), but an embodiment is not limited thereto and may be applied to various kinds of clock generators. Also, in some embodiments, the clock generator 100 may be implemented as one integrated circuit manufactured by a semiconductor process, and in some other embodiments, the clock generator 100 may include at least one semiconductor package including an integrated circuit and a board with the semiconductor package mounted thereon.

The clock generator 100 may include a phase/frequency detector (PFD) 110, a voltage generator 120, a voltage controlled oscillator (VCO) 130, and a frequency divider 140. In an embodiment, the phase/frequency detector 110 may be replaced with a phase detector. Also, according to an example embodiment, the VCO 130 may be implemented as a ring VCO and may include a voltage-to-current converter 131 and an oscillation circuit 132. The voltage-to-current converter 131 may include a resistor circuit 131_1 including a plurality of resistors. Also, the oscillation circuit 132 may include a load which affects a frequency of the output clock Fout, and as an example of a load, the oscillation circuit 132 may include a capacitor circuit 132_1 including a plurality of capacitors.

The input clock Fin may vibrate at a certain frequency, and for example, may be generated by a crystal oscillator (not shown) and may be provided to the clock generator 100. The output clock Fout may have a frequency (i.e., a target frequency) needed for a circuit block (for example, a digital block (not shown)) to which the output clock Fout is supplied. The circuit block may process a signal on the basis of the output clock Fout, and the clock generator 100 may generate the output clock Fout having a jitter characteristic for the circuit block. For example, the clock generator 100 may provide the output clock Fout to at least two circuit blocks using the output clock Fout having the same frequency, and when a jitter characteristic for a first circuit block (for example, one circuit block of the at least two circuit blocks) is low, the first circuit block may be provided with the output clock Fout having jitter which is greater than other circuit blocks. On the other hand, when the jitter characteristic for a second circuit block (for example, another one circuit block of the at least two circuit blocks) is relatively high, the second circuit block may be provided with the output clock Fout having jitter which is less than other circuit blocks.

The phase/frequency detector 110 may receive the input clock Fin provided from the outside of the clock generator 100 and may receive a divided output clock Fout/N from the frequency divider 140. The phase/frequency detector 110 may detect a phase difference and a frequency difference between the input clock Fin and the divided output clock Fout/N and may generate a detection signal Det corresponding to the detected phase difference and frequency difference. For example, the detection signal Det may include an up signal and a down signal, and depending on how closely a frequency of the input clock Fin matches a frequency of the divided output clock Fout/N, the phase/frequency detector 110 may activate an up signal and/or a down signal on the basis of a sign of the frequency difference between the input clock Fin and the divided output clock Fout/N.

The voltage generator 120 may receive the detection signal Det from the phase/frequency detector 110 and may generate a control voltage Vctrl on the basis of the detection signal Det. The control voltage Vctrl may have a level which depends on a phase difference represented by the detection signal Det. For example, the voltage generator 120 may include a charge pump and a loop filter. When a phase of the divided output clock Fout/N lags behind relatively, a level of the control voltage Vctrl may increase, and when a phase of the divided output clock Fout/N leads relatively, a level of the control voltage Vctrl may drop. Therefore, in a state where a loop is locked, the voltage generator 120 may generate the control voltage Vctrl having a certain level.

The VCO 130 may receive the control voltage Vctrl and may generate the output frequency Fout having a frequency based on the control voltage Vctrl. In example embodiments, the voltage-to-current converter 131 may receive the control voltage Vctrl to generate an internal current Iv corresponding thereto and may provide the generated internal current Iv to the oscillation circuit 132. Also, the oscillation circuit 132 may generate the output clock Fout having a frequency based on an input current (for example, a supply current), and for example, the oscillation circuit 132 may receive, as a supply current, the internal current Iv from the voltage-to-current converter 131 to generate the output clock Fout having a frequency based on the internal current Iv. For example, a frequency of the output clock Fout output from the oscillation circuit 132 may have a value which is determined based on a level of the internal current Iv and a capacitance value of the capacitor circuit 132_1.

According to example embodiments, the oscillation circuit 132 may directly receive the internal current Iv generated by the voltage-to-current converter 131, and as in a below-described embodiment, the oscillation circuit 132 may receive, as a supply current, an internal current having a level proportional to the internal current Iv. That is, in describing example embodiments, the term "internal current" may be a concept which includes the internal current Iv generated by the voltage-to-current converter 131 or a current which has a level proportional to the internal current Iv by processing (for example, digital-to-analog conversion or the like) the internal current Iv from the voltage-to-current converter 131.

According to an example embodiment, the voltage-to-current converter 131 may include the resistor circuit 131_1, and the resistor circuit 131_1 may include a plurality of resistors each having a resistance value (or an equivalent resistance value) which varies based on control information Ctrl_J. Also, the oscillation circuit 132 may include the capacitor circuit 132_1, and the capacitor circuit 132_1 may include a plurality of capacitors each having a capacitance value (or an equivalent capacitance value) which varies based on the control information Ctrl_J. In FIG. 1, it is illustrated that the control information Ctrl_J is provided to the resistor circuit 131_1 and the capacitor circuit 132_1, but an embodiment is not limited thereto. For example, in some embodiments, the control information Ctrl_J may include first control information for controlling the resistor circuit 131_1 and second control information for controlling the capacitor circuit 132_1.

The resistor circuit 131_1 may further include a plurality of switches (for example, first switches) disposed based on a plurality of resistors so as to vary a resistance value. The control information Ctrl_J may be digital information including a plurality of bits for switching of the first switches, and as a connection relationship between the plurality of resistors is changed based on the control information Ctrl_J, a resistance value of the resistor circuit 131_1 may vary. Similarly, the capacitor circuit 132_1 may further include a plurality of switches (for example, second switches) disposed based on a plurality of capacitors so as to vary an equivalent capacitance value. The control information Ctrl_J may be digital information including a plurality of bits for switching of the second switches, and as a connection relationship between the plurality of capacitors is changed based on the control information Ctrl_J, a capacitance value of the capacitor circuit 132_1 may vary.

The control information Ctrl_J may be information generated by an internal element of the clock generator 100, or may be information provided from the outside of the clock generator 100. As an implementation example, an integrated circuit (or a semiconductor device) including the clock generator 100 may include a control logic (not shown) for adjusting a jitter characteristic of the output clock Fout output from the clock generator 100, and the control logic may provide the control information Ctrl_J for increasing or decreasing the jitter of the output clock Fout. According to an embodiment, in response to the control information Ctrl_J, the clock generator 100 may generate output clocks Fout which have the same frequency but have different jitter characteristics.

The output clock Fout may be fed back to the frequency divider 140, and the frequency divider 140 may divide the fed-back output clock Fout to generate the divided output clock Fout/N and may provide the divided output clock Fout/N to the phase/frequency detector 110. For example, the frequency divider 140 may divide the output clock Fout on the basis of a ratio between a frequency of the input clock Fin and a target frequency of the output clock Fout.

An example which adjusts a jitter characteristic of the output clock Fout will be described below.

The VCO 130 may generate the output clock Fout having a jitter characteristic which varies, in response to the control information Ctrl_J, and for example, may adjust a resistance value of the resistor circuit 131_1 and a capacitance value of the capacitor circuit 132_1 to generate the output clock Fout which has the same frequency but has a jitter characteristic which varies based on the resistance value and the capacitance value. Power consumed by the clock generator 100 and a jitter magnitude of the output clock Fout may have an inversely proportional relationship therebetween, and thus, the jitter characteristic of the output clock Fout may vary based on a level of the internal current Iv provided to the oscillation circuit 132. For example, when a level of the internal current Iv provided to the oscillation circuit 132 is relatively high, the jitter of the output clock Fout may decrease, and when a level of the internal current Iv is relatively low, the jitter of the output clock Fout may increase. A resistance value of the resistor circuit 131_1 may be used to determine a level of the internal current Iv. For example, when the resistance value of the resistor circuit 131_1 is large, a level of the internal current Iv may decrease, and when the resistance value of the resistor circuit 131_1 is small, a level of the internal current Iv may increase.

A frequency of the output clock Fout output from the oscillation circuit 132 may have a value based on a level of the internal current Iv and the capacitance value of the capacitor circuit 132_1. For example, when the capacitance value of the capacitor circuit 132_1 is relatively small, the output clock Fout having a relatively high frequency may be generated from the internal current Iv having the same level, and when the capacitance value of the capacitor circuit 132_1 is relatively large, the output clock Fout having a relatively low frequency may be generated from the internal current Iv having the same level. According to an example embodiment, the clock generator 100 may adjust the resistance value of the resistor circuit 131_1 on the basis of the control information Ctrl_J and may adjust the capacitance value of the capacitor circuit 132_1 on the basis of a variation of the resistance value, thereby generating the output clock Fout which has the same frequency but has a jitter characteristic which varies.

According to an example embodiment, the clock generator 100 may generate and provide the output clock Fout optimized for each of various kinds of digital blocks requiring different jitter characteristics. That is, the output clock Fout may be generated from the internal current Iv having a relatively low level for each digital block requiring a relatively low jitter characteristic, and thus, undesired power consumption may be prevented from increasing. For example, a jitter of 5 ps or less may be needed for a digital block performing Wi-Fi analog-digital conversion operation, but when a jitter of 15 ps is acceptable for some digital blocks other than the digital block performing the Wi-Fi analog-digital conversion operation but included with the digital block performing the Wi-Fi analog-digital conversion, the clock generator 100 may generate the output clock Fout optimized for each requirement, thereby decreasing undesired power consumption. Also, in the digital block performing the Wi-Fi analog-digital conversion operation, a requirement for jitter may be changed with time, and based on the changed requirement, the clock generator 100 may change a jitter characteristic of the output clock Fout used for the same operation, thereby decreasing undesired power consumption.

That is, according to the above-described example embodiment, a multi-standard clock generator for generating a broad-range frequency and for reconfiguring jitter characteristic and power consumption characteristic may be provided, and for example, may ensure dynamic scaling (DFS) of a frequency having a broad range from about 9 MHz to about 2.4 GHz and may provide jitter and power consumption optimized for each standard according to an increase in consumption of a multi-standard application.

When the clock generator 100 illustrated in FIG. 1 is included in an electronic system (or an electronic device), one clock generator 100 may be provided based on one digital block, or the electronic system may be implemented so that the one clock generator 100 is shared by a plurality of digital blocks. For example, when the same clock generator 100 is provided based on each of different digital blocks, the clock generator 100 may generate the output clock Fout optimized for a corresponding digital block. Also, one clock generator 100 may be shared and time-divisionally used by a plurality of digital blocks and may generate the output clock Fout which has a target frequency for each of the digital blocks and has a jitter characteristic optimized for each digital block.

Figure 2:
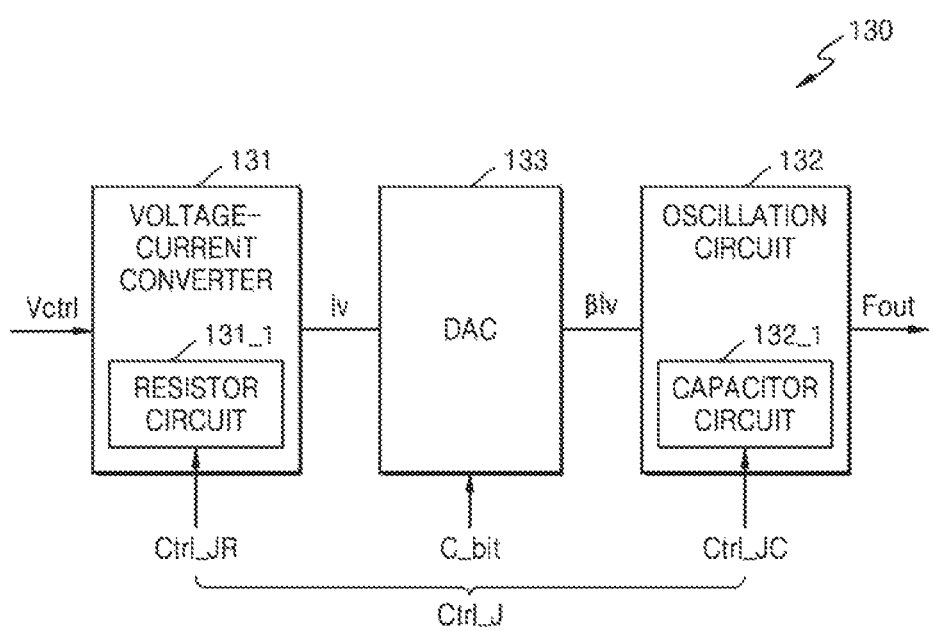
FIG. 2 is a block diagram illustrating an implementation example of a voltage controlled oscillator of FIG. 1, according to an example embodiment.

FIG. 2 is a block diagram illustrating an implementation example of the VCO 130 of FIG. 1, according to an example embodiment. In FIG. 2, an example where the VCO 130 further includes a digital-to-analog converter (DAC) 133 as well as the voltage-to-current converter 131 and the oscillation circuit 132 according to the above-described embodiment is illustrated.

Referring to FIGS. 1 and 2, the voltage-to-current converter 131 may receive a control voltage Vctrl and may generate an internal current Iv corresponding thereto. Also, the DAC 133 may receive a digital control bit C_bit from the outside of the DAC 133 along with receiving the internal current Iv and may adjust a level of the internal current Iv in response to the digital control bit C_bit, thereby generating a first current βIv (that is, level-adjusted internal current). For example, the first current βIv may have a level proportional to the internal current Iv, and a proportional value β thereof may vary based on the digital control bit C_bit. Also, the oscillation circuit 132 may receive the first current βIv as the internal current according to the above-described embodiment and may generate an output clock Fout having a frequency based on the first current βIv.

The control information Ctrl_J may include first control information Ctrl_JR for controlling the resistor circuit 131_1 and second control information Ctrl_JC for controlling the capacitor circuit 132_1. According to the above-described embodiment, the voltage-to-current converter 131 may include a plurality of first switches which are turned on according to control based on the first control information Ctrl_JR and vary a resistance value, and the oscillation circuit 132 may include a plurality of second switches which are turned on according to control based on the second control information Ctrl_JC and vary a capacitance value. Based on the arrangement of the resistors and the first switches of the resistor circuit 131_1 and the arrangement of the capacitors and the second switches of the capacitor circuit 132_1, the first control information Ctrl_JR and the second control information Ctrl_JC may be control information having the same bit value, or may be control information having different bit values.

The DAC 133 may be provided for compensating for a frequency error of the output clock Fout output from the clock generator 100. As an operation example, in the clock generator 100, an error may occur in an operating characteristic of the VCO 130 and/or a voltage-to-current conversion characteristic of the voltage-to-current converter 131 due to a manufacturing process difference, and the clock generator 100 may further include an automatic frequency control (AFC) circuit (not shown) as an element for compensating for the error. The AFC circuit may monitor the output clock Fout and may generate a digital control bit C_bit based thereon, thereby adjusting a level of the first current βIv.

According to the above-described embodiment, a resistance value of the resistor circuit 131_1 may be adjusted based the first control information Ctrl_JR, and a capacitance value of the capacitor circuit 132_1 may be adjusted based on the second control information Ctrl_JC, thereby providing the clock generator 100 for reconfiguring jitter and power consumption.

Figure 3:
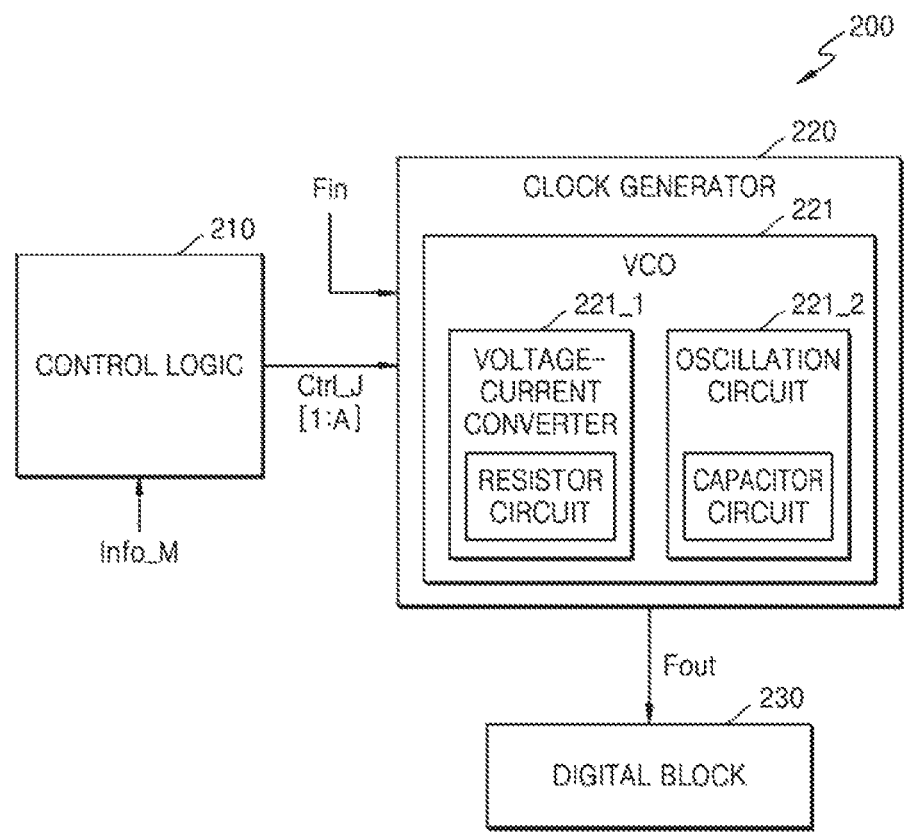
FIG. 3 is a block diagram illustrating an integrated circuit including a clock generator according to an example embodiment.

FIG. 3 is a block diagram illustrating an integrated circuit 200 including a clock generator according to an example embodiment. For example, the integrated circuit 200 may be implemented as a semiconductor device such as a semiconductor chip or a semiconductor package, or may be included in a semiconductor device.

Referring to FIG. 3, the integrated circuit 200 may include a control logic 210, a clock generator 220, and a digital block 230. Various elements included in the integrated circuit 200 may be implemented as various types, and for example, the clock generator 220 may be implemented as a separate semiconductor device. Alternatively, as various modification examples, at least one of the control logic 210 and the digital block 230 may be an element which is included in the same semiconductor device along with the clock generator 220. In FIG. 3, for convenience of description, only one digital block 230 is illustrated, but a number of various circuit blocks for performing signal processing based on an output clock Fout from the clock generator 220 may be further included in the integrated circuit 200.

The clock generator 220 may correspond to a clock generator according to the above-described embodiment illustrated with respect to FIGS. 1 and 2. The clock generator 220 may receive an input clock Fin to generate the output clock Fout. For example, the clock generator 220 may include a VCO 221, the VCO 221 may include a voltage-to-current converter 221-1 and an oscillation circuit 221-2, the voltage-to-current converter 221-1 may include a resistor circuit, and the oscillation circuit 221-2 may include a capacitor circuit. The output clock Fout from the clock generator 220 may be provided to the digital block 230, and a jitter characteristic of the output clock Fout provided from the digital block 230 according to an example embodiment may vary based on control information Ctrl_J[1:A] from the control logic 210. In FIG. 3, for convenience of description, only the VCO 221 included in the clock generator 220 is illustrated, but various elements such as a phase detector and a voltage generator each associated with generating of the output clock Fout may be included in the clock generator 220.

The control logic 210 may generate the control information Ctrl_J[1:A] and may provide the control information Ctrl_J[1:A] to the clock generator 220. According to the above-described embodiment, a resistance value of the resistor circuit of the VCO 221 may vary based on the control information Ctrl_J[1:A], and a capacitance value of the capacitor circuit may vary based on the control information Ctrl_J[1:A]. For example, in FIG. 3, A pieces of control information Ctrl_J[1:A] are illustrated, and the clock generator 220 may generate the output clock Fout having the same frequency on the basis of each of the A pieces of control information Ctrl_J[1:A]. Also, the clock generator 220 may generate output clocks Fout having different jitter characteristics on the basis of the A pieces of control information Ctrl_J[1:A]. Also, according to the above-described embodiment illustrated in FIG. 3, each of the A pieces of control information Ctrl_J[1:A] may include first control information for adjusting a resistance value and second control information for adjusting a capacitance value.

The control logic 210 may generate the control information Ctrl_J[1:A] on the basis of a determination operation thereof or mode information Info_M from outside the control logic 210. The mode information Info_M may include various information associated with an operation of the clock generator 220. For example, the mode information Info_M may include information representing a low power mode or a high power mode, and when the integrated circuit 200 operates in the low power mode, the control logic 210 may output control information Ctrl_J[1:A] such that power consumed by generating the output clock Fout may decrease and relatively large jitter may occur in the output clock Fout, based on the control information Ctrl_J[1:A] from the control logic 210. On the other hand, when the integrated circuit 200 operates in the high power mode, the control logic 210 may output control information Ctrl_J[1:A] such that the power consumed by generating the output clock Fout may increase and relatively small jitter may occur in the output clock Fout, based on the control information Ctrl_J[1:A] from the control logic 210.

According to an example embodiment, when the integrated circuit 200 performs a function associated with communication, the mode information Info_M may include pieces of information associated with a communication mode. For example, when the mode information Info_M represents a long term evolution (LTE) communication mode requiring a high jitter characteristic, the control logic 210 may output control information Ctrl_J[1:A] such that the power consumed by generating the output clock Fout may increase and relatively small jitter may occur in the output clock Fout, based on the control information Ctrl_J[1:A] from the control logic 210. On the other hand, when the mode information Info_M represents a 3rd generation (3G) communication mode requiring a relatively low jitter characteristic, the control logic 210 may output control information Ctrl_J[1:A] such that the power consumed by generating of the output clock Fout may decrease and relatively large jitter may occur in the output clock Fout, based on the control information Ctrl_J[1:A] from the control logic 210.

The control logic 210 may generate the control information Ctrl_J[1:A] on the basis of various determination criterions in addition to the low power mode and the high power mode. For example, as described above, when a jitter characteristic needed for the digital block 230 varies with time, the control logic 210 may generate the control information Ctrl_J[1:A] for optimizing the jitter characteristic of the output clock Fout provided to the digital block 230 according to the specification of the jitter characteristic at various times.

The clock generator 220 may generate the output clock Fout having the same frequency in response to A pieces of different control information Ctrl_J[1:A] and may vary the jitter characteristic of the output clock Fout. For example, when one piece of control information (for example, Ctrl_J [1]) is provided to the clock generator 220, the clock generator 220 may control the resistance value of the resistor circuit to decrease (or an internal current may increase), and based thereon, the capacitance value of the capacitor circuit to increase such that the output clock Fout with an enhanced jitter characteristic may be generated. On the other hand, when other control information (for example, Ctrl_J[A]) is provided to the clock generator 220, the clock generator 220 may control the resistance value of the resistor circuit to increase, and based thereon, the capacitance value of the capacitor circuit to decrease such that the output clock Fout where a frequency thereof is identically maintained and a jitter characteristic thereof decreases may be generated.

Figure 4:
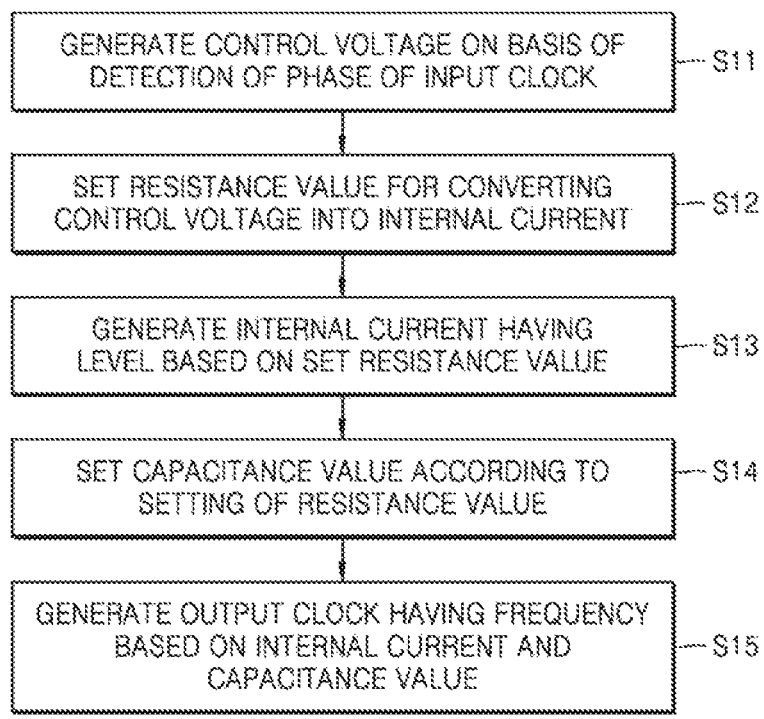
FIG. 4 is a flowchart illustrating an operating method of a clock generator according to an example embodiment.

FIG. 4 is a flowchart illustrating an operating method of a clock generator according to an example embodiment.

Referring to FIG. 4, the clock generator according to an example embodiment may include a VCO, and the VCO may generate an output clock having a frequency corresponding to a control voltage input thereto. Also, the VCO may include a converter which converts the control voltage into a current and an oscillation circuit which generates the output clock having a target frequency on the basis of a converted current, as described above.

In operation S11, the VCO may generate the control voltage on the basis of detecting a phase of an input clock. For example, according to the above-described embodiment, the VCO may detect a phase and a frequency of each of the input clock and a signal obtained by dividing the output clock, generate the control voltage corresponding to a detection result, and provide the generated control voltage as an input of the VCO.

In converting the control voltage into a current, a level of the current may vary based on a resistance value of a resistor circuit included in the converter, and the resistance value for converting the control voltage into an internal current may be set in operation S12. The resistance value for converting the control voltage into the internal current may be set based on control information from the inside or the outside of the clock generator. The control information may include information for setting a clock generating operation of the clock generator, and based on the control information, the clock generator may consume low power and may generate the output clock having large jitter, or may generate the output clock having small jitter and may consume high power. In operation S13, the clock generator may generate the internal current having a level based on the set resistance value.

The oscillation circuit may include a capacitor circuit including a plurality of capacitors, and a capacitance value of the capacitor circuit may be set based on the set resistance value of the resistor circuit in operation S14. The oscillation circuit may generate the output clock having a frequency based on the generated internal current and the set capacitance value in operation S15.

Figure 5:
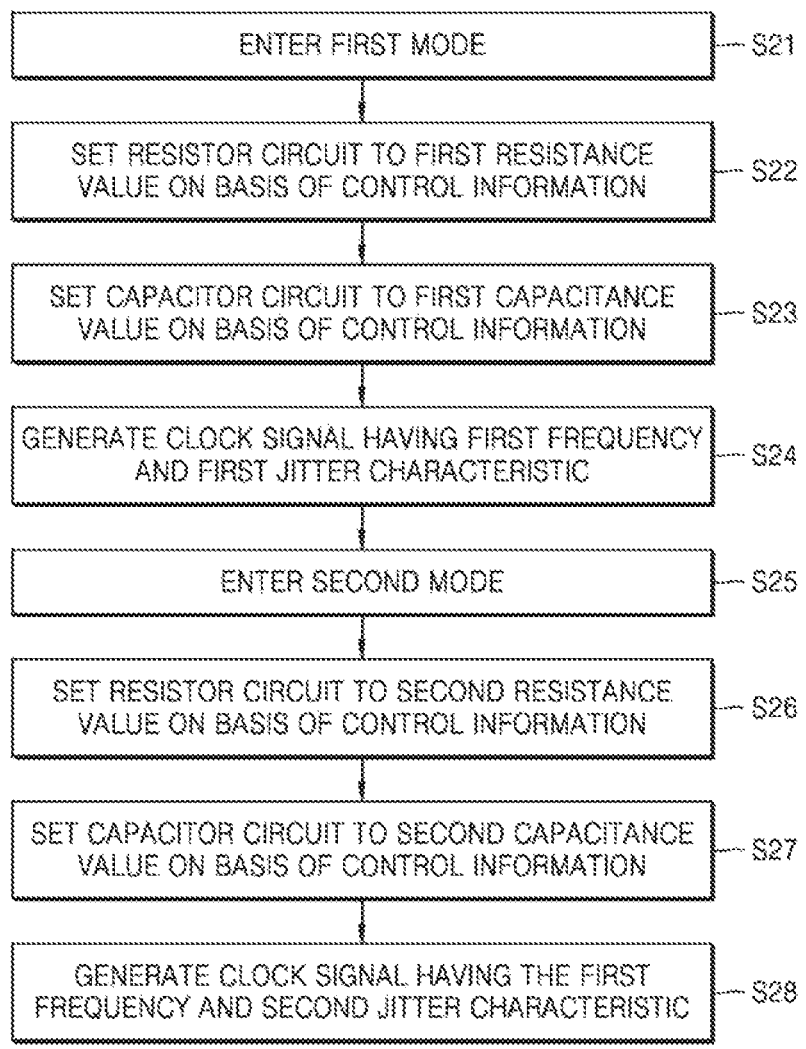
FIG. 5 is a flowchart illustrating an operating method of a clock generator according to another example embodiment.

FIG. 5 is a flowchart illustrating an operating method of a clock generator according to another example embodiment. In FIG. 5, an example is illustrated in which output clocks having the same frequency are generated based on changing of a mode but the output clocks having different jitter characteristics are generated based on the mode.

Referring to FIG. 5, as an integrated circuit including a clock generator enters a first mode in operation S21. Control information corresponding to the first mode may be provided to the clock generator, and a resistance value of a resistor circuit provided for voltage-to-current conversion by the clock generator may be set to a first resistance value on the basis of the control information in operation S22. Also, a capacitance value of a capacitor circuit provided for setting an output frequency of an oscillation circuit of the clock generator may be set to a first capacitance value on the basis of the control information in operation S23. A clock signal having a first frequency and a first jitter characteristic may be generated based on the set resistance value and capacitance value in operation S24.

The integrated circuit including the clock generator may enter a second mode in operation S25. Control information corresponding to the second mode may be provided to the clock generator, and based on the control information, the resistance value of the resistor circuit may be set to a second resistance value in operation S26 and the capacitance value of the capacitor circuit may be set to a second capacitance value in operation S27. A clock signal having second jitter characteristic and the first frequency which is the same as a frequency in the first mode may be generated based on the set resistance value and capacitance value in operation S28.

In the embodiment of FIG. 5, the clock generator according to an example embodiment may vary the jitter characteristic of the output clock in performing an operation thereof. For example, the clock generator may change a setting of each of the resistance value and the capacitance value without releasing a locking state in a state where the output clock has a target frequency, thereby increasing or decreasing the jitter of the output clock. That is, without performing turn-on/off control on the clock generator so as to change an operation mode of the clock generator, the clock generator according to an example embodiment may vary the jitter of the output clock in a state which maintains the target frequency, and thus, may vary power consumed by the clock generator. In other words, the clock generator according to an example embodiment may vary the jitter of the output clock, based only on the mode change while maintaining the locked target frequency.

Figure 6:
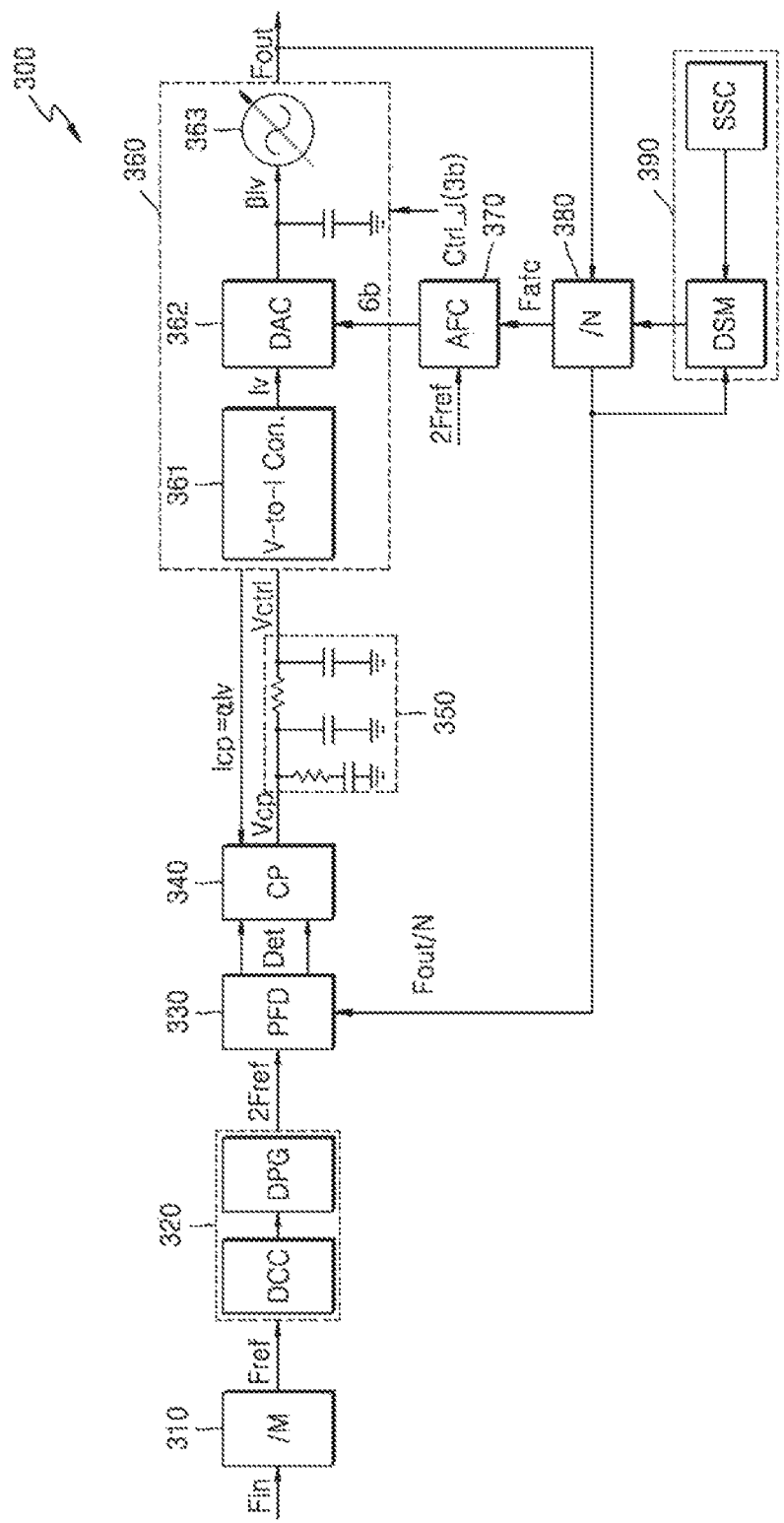
FIG. 6 is a block diagram illustrating a detailed implementation example of a clock generator according to an example embodiment.

FIG. 6 is a block diagram illustrating a detailed implementation example of a clock generator 300 according to an example embodiment.

Referring to FIG. 6, the clock generator 300 may include a phase/frequency detector (PFD) 330, a charge pump (CP) 340, a loop filter 350, a VCO 360, and a frequency divider (/N) 380. In an embodiment, the phase/frequency detector 330 may be replaced with a phase detector. Also, in some embodiments of the clock generator 300, the charge pump 340 and the loop filter 350 may be included in a voltage generator as in the above-described embodiment. The frequency divider 380 may divide an output clock Fout by N to generate a divided output clock Fout/N.

The VCO 360 may include a voltage-to-current (V-to-I) converter 361, a digital to analog converter (DAC) 362, and an oscillation circuit 363. Although not shown in FIG. 6, according to the above-described embodiments, the voltage-to-current converter 361 may include a resistor circuit including a plurality of resistors, the oscillation circuit 363 may include a capacitor circuit including a plurality of capacitors, and a resistance value of resistor circuit and a capacitance value of the capacitor circuit may be adjusted based on control information Ctrl_J. The voltage-to-current converter 361 may adjust a level of a current on the basis of a variation of the resistance value, and thus, may be referred to as a resistive voltage-to-current converter.

According to an example embodiment, the clock generator 300 may include a divider (/M) 310 which divides an input clock Fin by M to generate a first reference clock Fref and a frequency multiplier 320 which multiplies a frequency of the first reference clock Fref. According to an embodiment, the frequency multiplier 320 may include a duty cycle correction (DCC) circuit and a double pulse generator (DPG), and in FIG. 6, an example where the frequency multiplier 320 increases the frequency of the first reference clock Fref by two times to generate a second reference clock 2Fref is illustrated. However, this is only an example, and the frequency multiplier 320 may be more than two times.

The phase/frequency detector 330 may receive the second reference clock 2Fref from the frequency multiplier 320 and the divided output clock Fout/N from the frequency divider 380 and may generate a detection signal Det based on a phase difference and a frequency difference between the second reference clock 2Fref and the divided output clock Fout/N. That is, in the embodiment illustrated in FIG. 6, the phase/frequency detector 330 may receive the second reference clock 2Fref as an input clock and may perform a phase/frequency detection operation on the second reference clock 2Fref.

The charge pump 340 may generate a pump output voltage Vcp in response to the detection signal Det, and the loop filter 350 may perform signal processing (for example, integral processing) based on the pump output voltage Vcp to generate a control voltage Vctrl. Also, according to the above-described embodiments, the voltage-to-current converter 361 may receive the control voltage Vctrl to generate an internal current Iv corresponding thereto, and the DAC 362 may generate a first current βIv proportional to the internal current Iv on the basis of the internal current Iv and a control bit (for example, a 6-bit digital signal) and may provide the first signal βIv to the oscillation circuit 363. That is, in the embodiment illustrated in FIG. 6, the oscillation circuit 363 may receive the first current βIv as an internal current according to the above-described embodiment and may generate an output clock Fout corresponding thereto.

According to an example embodiment, the voltage-to-current converter 361 may further generate a second current αIv proportional to the internal current Iv, and the generated second current αIv may be provided as a pump current Icp used by the charge pump 340. For example, in an operation of the clock generator 300, a level of a current used by the charge pump 340 may vary based on various factors such as a source voltage and a temperature change (or a process voltage temperature (PVT) change), and the second current αIv with the PVT change reflected therein may be provided to the charge pump 340 by the voltage-to-current converter 361, thereby compensating for a variation of a current.

An example where control information Ctrl_J(3b) has a 3-bit value and is provided to the voltage-to-current converter 361 and the oscillation circuit 363 is illustrated in FIG. 6, but this is only an example, and the embodiment is not limited thereto. For example, as described above, different control information may be provided to the voltage-to-current converter 361 and the oscillation circuit 363. Based on the number of switches provided in each of the voltage-to-current converter 361 and the oscillation circuit 363, the different control information provided to the voltage-to-current converter 361 and the oscillation circuit 363 may have a same number of bits or a different number of bits.

According to an example embodiment, the clock generator 300 may further include an AFC circuit 370 which generates a control bit 6b corresponding to the above-described digital control bit and provides the control bit 6b to the DAC 362. The AFC circuit 370 may receive a feedback signal Fafc associated with AFC from the frequency divider 380 and may receive the above-described second reference clock 2Fref and may generate the above-described control bit 6b on the basis of a result obtained by comparing the feedback signal Fafc with the second reference clock 2Fref. For example, the AFC circuit 370 may generate the control bit 6b for setting a β value of the first current βIv output from the DAC 362, for compensating for a variation of the internal current Iv caused by a deviation of a manufacturing process performed on the clock generator 300.

According to an example embodiment, the clock generator 300 may further include a spread spectrum clock controller 390, and the SSC controller 390 may be provided for decreasing an influence of electromagnetic interface (EMI) on adjacent circuits. The SSC controller 390 may include a spread spectrum clock generator (SSC) and a delta-sigma modulator (DSM) and may provide the frequency divider 380 with information for controlling a division rate of the frequency divider 380. For example, the spread spectrum clock controller 390 may provide information to the frequency divider 380 so that the output clock Fout is divided at a division rate selected from among a plurality of integer division rates. As an integer division rate varies for each loop, an average division rate of the frequency divider 380 may be adjusted by units of prime numbers.

An operating characteristic of the clock generator 300 according to a configuration embodiment of the clock generator 300 illustrated in FIG. 6 will be described below.

A loop bandwidth of the clock generator 300 may be determined based on overall noise characteristic, and particularly, it may be required to maintain an optimized loop bandwidth on the basis of a process and a PVT change, for a high jitter characteristic. For example, the loop bandwidth may be maintained by continuously monitoring a control voltage Vctrl based on phase/frequency comparison. An internal current Iv which is generated by the voltage-to-current converter 361 by reflecting the PVT change therein may be provided to the charge pump 340 and the oscillation circuit 363 on the basis of a mirroring factor (for example, α and β), and thus, may be determined as a unit current of each of the charge pump 340 and the oscillation circuit 363. Despite the PVT change, the loop bandwidth may be maintained in proportion to the first reference clock Fref on the basis of a unit current with the mirroring factor reflected therein.

As described above, since the AFC circuit 370 is included in the clock generator 300, a mismatch of a pump current of the charge pump 340 may be minimized by compensating for an error of a voltage-current variation characteristic. Since the frequency multiplier 320 including the DCC circuit and the DPG circuit is applied to the clock generator 300, a spur corresponding to a type of jitter may be decreased by minimizing a duty cycle variation of an input clock Fin of the clock generator 300. Since the second reference clock 2Fref having a frequency increased by the frequency multiplier 320 is used, in-band noise may be reduced, and moreover, quantization noise occurring in a delta-sigma modulation process may be prevented.

Figure 7:
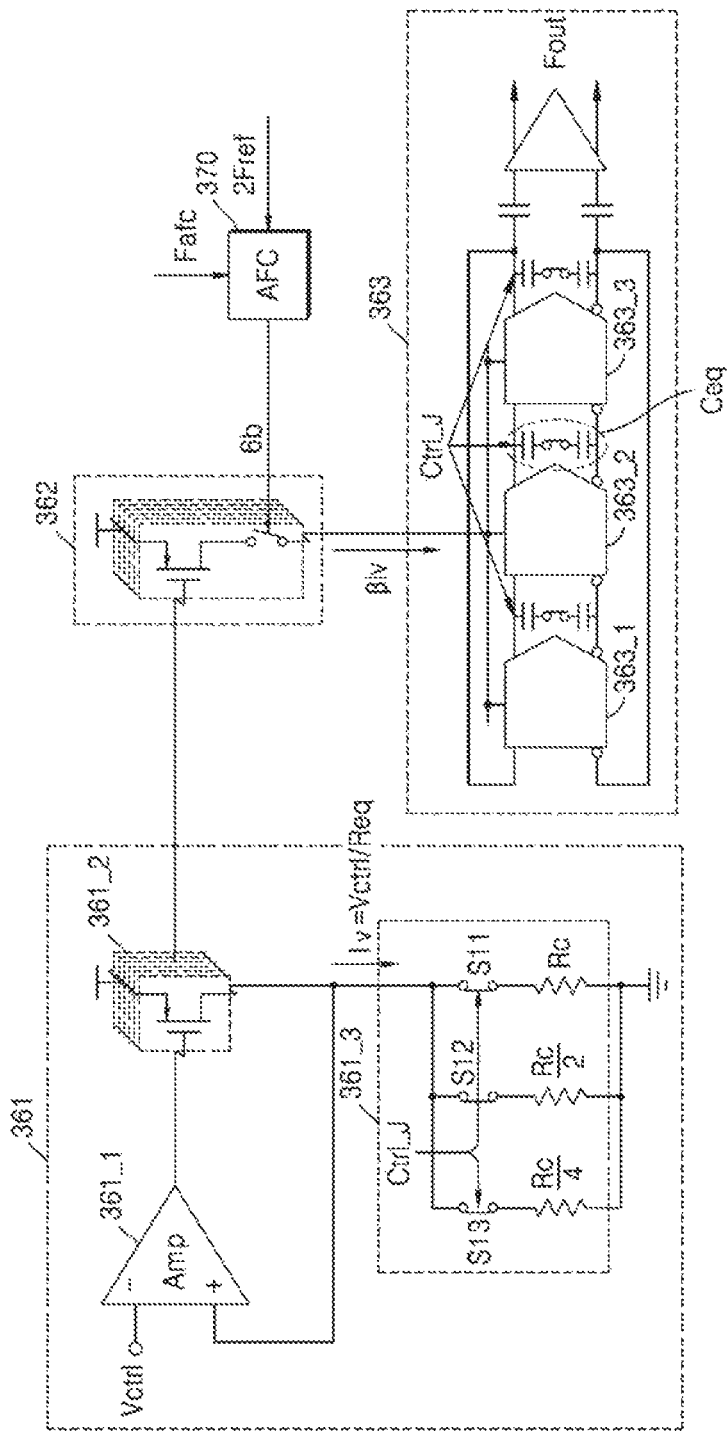
FIG. 7 is a circuit diagram illustrating an implementation example of a voltage controlled oscillator illustrated in FIG. 6, according to an example embodiment.

FIG. 7 is a circuit diagram illustrating an implementation example of the VCO 360 illustrated in FIG. 6, according to an example embodiment. In FIG. 7, an implementation example of each of a voltage-to-current converter 361, a digital to analog converter (DAC) 362, and an oscillation circuit 363 is illustrated as elements of the VCO 360, and an AFC circuit 370 for providing a control bit 6b to the VCO 360 is further illustrated.

Referring to FIGS. 6 and 7, the voltage-to-current converter 361 may include an amplifier 361_1 which receives a control voltage Vctrl through one input terminal thereof and is connected to an output of the voltage-to-current converter 361 through another input terminal. The voltage-to-current converter 361 may further include one or more first transistors 361_2 connected to an output of the amplifier 361_1 and a resistor circuit 361_3 connected in common to one end of each of the first transistors 361_2. That is, one end of each of the first transistors 361_2 is connected to the resistor circuit 361_3. The resistor circuit 361_3 may include a plurality of resistors Rc, Rc/2, and Rc/4 arranged in parallel and a plurality of first switches S11 to S13 respectively corresponding to the resistors Rc, Rc/2, and Rc/4. A switching state of each of the first switches S11 to S13 may be controlled based on the above-described control information Ctrl_J, and thus, a resistance value (for example, an equivalent resistance value Req) of the resistor circuit 361_3 may vary. For example, the resistors Rc, Rc/2, and Rc/4 may be arranged in parallel. When all of the first switches S11 to S13 are turned on, the equivalent resistance value Ref may be a minimum value, and based on the control information Ctrl_J, when at least some of the first switches S11 to S13 are turned off, the equivalent resistance value Ref may be increased respective to the minimum value.

An output from the amplifier 361_1 may be provided to a gate electrode of each of the first transistors 361_2, and the internal current Iv having a level based on a switching state of each of the first switches S11 to S13 may be generated. A level of the internal current Iv may be determined based on the control voltage Vctrl and the equivalent resistance value Req, and thus, a level of the internal current Iv may be adjusted based on a value of the control information Ctrl_J. That is, when the equivalent resistance value Req increases based on the switching state of each of the first switches S11 to S13, a level of the internal current Iv may decrease, and when the equivalent resistance value Req decreases, a level of the internal current Iv may increase, thereby adjusting power consumption and jitter having a trade-off relationship in the clock generator 300.

The DAC 362 may include a plurality of second transistors connected to an output of the voltage-to-current converter 361, and moreover, may include a plurality of switches which are turned on/off according to control based on the control bit 6b from the AFC circuit 370. For example, the first transistors 361_2 of the voltage-to-current converter 361 and the second transistors of the DAC 362 may configure a current mirror, and the DAC 362 may generate the first current βIv having a level proportional to the internal current Iv. A level of the first current βIv may be adjusted based on the number of switches which are turned on in response to the control bit 6b from the AFC circuit 370.

The oscillation circuit 363 may include a plurality of delay cells 363_1 to 363_3, and each of the plurality of delay cells 363_1 to 363_3 may receive the first current βIv as a bias current (or a supply current). The amount of delay of each of the delay cells 363_1 to 363_3 may be adjusted based on a level of the first current βIv corresponding to the bias current. That is, a frequency value of the output clock Fout output from the oscillation circuit 363 may vary based on the amount of delay of each of the delay cells 363_1 to 363_3. A resistance value of the resistor circuit 361_3 of the voltage-to-current converter 361 described above may affect the frequency value of the output clock Fout output from the oscillation circuit 363.

According to an example embodiment, each of the delay cells 363_1 to 363_3 may include a load having a size capable of being adjusted, and for example, each of the delay cells 363_1 to 363_3 may include a plurality of capacitors and a plurality of second switches respectively corresponding to the plurality of capacitors. A connecting state of the capacitors of each of the delay cells 363_1 to 363_3 may be controlled based on a value of the control information Ctrl_J, and thus, a capacitance value of each of the delay cells 363_1 to 363_3 may be adjusted.

As in the above-described embodiment, the clock generator 300 may generate output clocks Fout having the same frequency and different jitter characteristics, and thus, a capacitance value of the oscillation circuit 363 may be adjusted based on a variation of a resistance value of the resistor circuit 361_3 of the voltage-to-current converter 361. For example, when a level of the first current βIv increases due to a reduction in the resistance value of the resistor circuit 361_3, the capacitance value of the oscillation circuit 363 may be adjusted to have a relatively large value, and when a level of the first current βIv decreases due to an increase in the resistance value of the resistor circuit 361_3, the capacitance value of the oscillation circuit 363 may be adjusted to have a relatively small value. In the embodiment of FIG. 7, for conciseness only one equivalent capacitance value Ceq is illustrated based on one delay cell, and for convenience of description, capacitors forming the equivalent capacitance value Ceq are illustrated outside a delay cell. However, the capacitors may be described as being provided in the delay cell. According to an example embodiment, the oscillation circuit 363 may generate the output clock Fout including a differential signal, and a configuration where a capacitor operating as a buffer capacitor is further provided in addition to the capacitors of the delay cells is illustrated.

Figure 8:
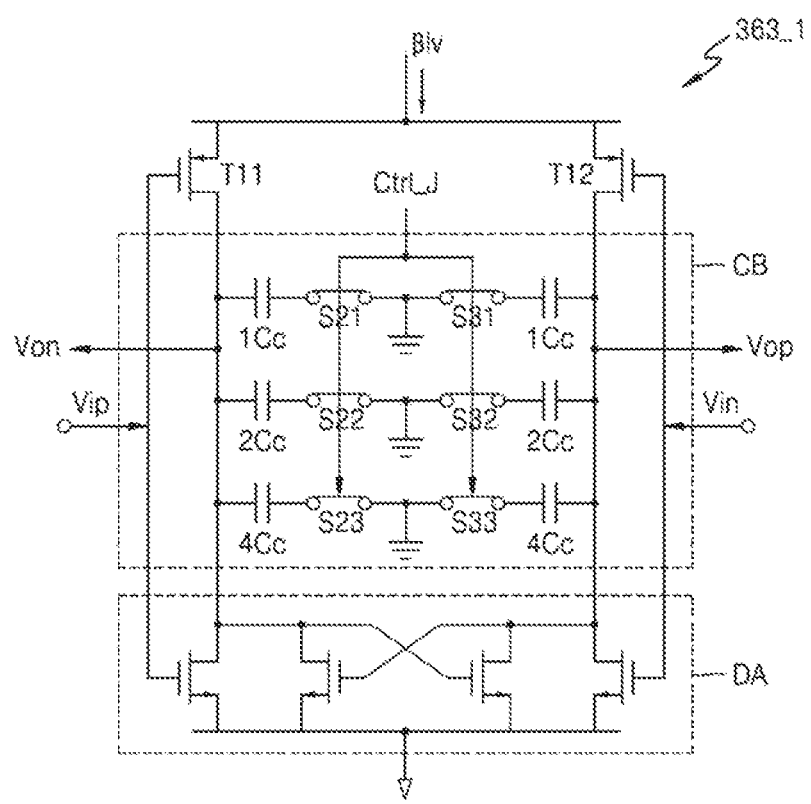
FIG. 8 is a circuit diagram illustrating an implementation example of one delay cell of FIG. 7, according to an example embodiment.

FIG. 8 is a circuit diagram illustrating an implementation example of one delay cell of FIG. 7, according to an example embodiment. In FIG. 8, an implementation example of a first delay cell 363_1 is illustrated, but each of the delay cells 363_1 to 363_3 may be implemented to have the same configuration as a configuration illustrated in FIG. 8.

Referring to FIGS. 6 to 8, according to an embodiment, the first delay cell 363_1 may receive a first current βIv as a supply current and may include two or more transistors T11 and T12, a plurality of transistors configuring a differential amplifier DA, and a capacitor block CB. The first delay cell 363_1 may receive a differential input Vin and Vip to generate a differential output Vop and Von corresponding thereto. The differential output Vop and Von may be provided as an input of another adjacent delay cell, and a differential output of one of the plurality of delay cells 363_1 to 363_3 may correspond to the above-described output clock Fout.

According to an example embodiment, the capacitor block CB may include a plurality of capacitors 1Cc, 2Cc, and 4Cc and a plurality of second switches S21 to S23 and S31 to S33, as illustrated in FIG. 8, and switching of the second switches S21 to S23 and S31 to S33 may be controlled based on the above-described control information Ctrl_J. As an operation example, when the second switches S21 to S23 and S31 to S33 are turned on, the plurality of capacitors 1Cc, 2Cc, and 4Cc may be connected to one another in parallel, and thus, an equivalent capacitance value Ceq may increase. On the other hand, when one or more of the second switches S21 to S23 and S31 to S33 are turned off, the number of capacitors electrically connected to one another may decrease, and thus, the equivalent capacitance value Ceq may decrease.

In order to maintain a constant frequency of the output clock Fout, the equivalent capacitance value Ceq of each of the plurality of capacitors 1Cc, 2Cc, and 4Cc may need to be reduced based on an increase in the resistance value of the resistor circuit 361_3. As an implementation example, according to a circuit configuration illustrated in FIGS. 7 and 8, when the control information Ctrl_J having the same bit value is applied to the resistor circuit 361_3 and the first delay cell 363_1, the equivalent capacitance value Ceq may decrease in a case where the resistance value of the resistor circuit 361_3 increases, and the equivalent capacitance value Ceq may increase in a case where the resistance value of the resistor circuit 361_3 decreases. For example, referring to FIGS. 7 and 8, when all of the first switches S11 to S13 and the second switches S21 to S23 and S31 to S33 are turned on, the equivalent resistance value Req may be the minimum (for example, Rc/7), and based thereon, the equivalent capacitance value Ceq may be the maximum (for example, 7Cc). On the other hand, when only the first switch S11 is turned on, the equivalent resistance value Req may be the maximum (for example, Rc), and as only the second switches S21 and S31 are turned on based thereon, the equivalent capacitance value Ceq may be the minimum (for example, 1Cc). Also, despite a variation of each of the equivalent resistance value Req and the equivalent capacitance value Ceq, a value obtained by multiplying the equivalent resistance value Req and the equivalent capacitance value Ceq may be constant, and thus, a frequency value of the output clock Fout may be maintained to be constant.

Configurations of the resistor circuit 361_3, the capacitor block CB, and the switches according to embodiments may be implemented as various types. That is, a circuit may be configured so that, under a condition where the frequency value of the output clock Fout is maintained to be identical or to be constant within a certain range, the equivalent capacitance value Ceq decreases based on an increase in the equivalent resistance value Req and the equivalent capacitance value Ceq increases based on a reduction in the equivalent resistance value Req. For example, the number and connection relationship of resistors and capacitors may be variously implemented, and a circuit may be implemented so that a desired equivalent resistance value Req and a desired equivalent capacitance value Ceq are set based on the control information Ctrl_J. For example, the resistors of the resistor circuit 361_3 and the capacitors of the capacitor block CB may be connected in series or parallel, or may be implemented by a combination of serial and parallel connections. Also, different control information may be provided to the resistor circuit 361_3 and the capacitor block CB and may have different bit values or a different number of bits.

The clock generator 300 configured in the manner described with reference to FIGS. 6-8 may be provided, and thus, a jitter characteristic and a power consumption characteristic may be reconfigured based on a trade-off relationship between noise and power. For example, a magnitude of a jitter L(f) in a frequency domain may be expressed as the following Equation (1).

$$L(f) = \frac{2kT}{\beta I_v}\left(\frac{1}{(V_{DD}-V_{th})}\eta + \frac{1}{V_{DD}}\right)\left(\frac{f_0}{f}\right)^2 \quad \text{[Equation 1]}$$

As shown in Equation (1), a jitter L(f) in a frequency domain may have values associated with a Boltzmann constant k, a temperature T, a source voltage VDD applied to a transistor of the oscillation circuit 363, a threshold voltage Vth, a target frequency fo, a first current βIv, and a constant η relevant to a noise factor of a manufacturing process. Therefore, when the target frequency fo is the same, the magnitude of the jitter L(f) may have a value which is inversely proportional to a level of the first current βIv. For this reason, in a case where a charging/discharging operation based on a metal oxide semiconductor (MOS) transistor and a capacitor of the oscillation circuit 363 is performed, when a level of a current applied to a transistor is high despite the target frequency fo being the same, a thermal resistance may decrease, and due to this, jitter may decrease. Also, a reconfiguration of each of the jitter and power consumption of the clock generator 300 may be controlled by a passive element, and thus, an output frequency may be relatively less affected by a temperature change.

Figure 9:
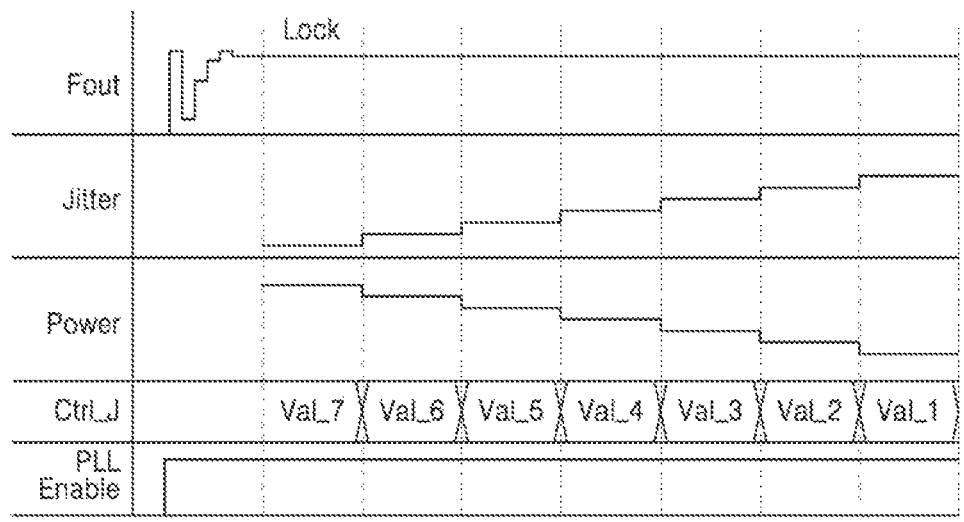
FIGS. 9 and 10 are circuit diagrams illustrating operation examples of a clock generator according to an example embodiment.
Figure 10:
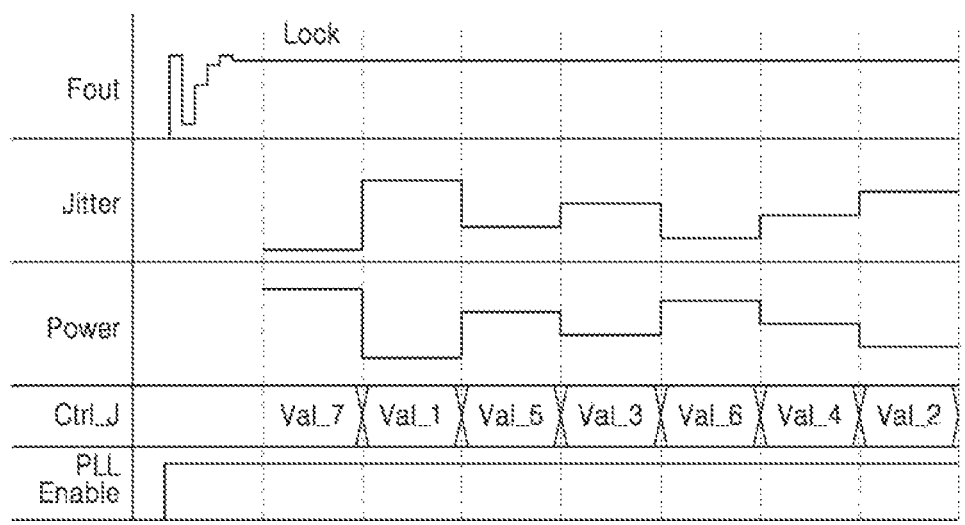

FIGS. 9 and 10 are circuit diagrams illustrating an operation example of a clock generator according to an example embodiment. In an example of FIGS. 9 and 10, the clock generator may correspond to the clock generator according to the above-described embodiments of FIGS. 1-8 and may be assumed to include a phase-locked loop (PLL).

Referring to FIGS. 9 and 10, the clock generator may be enabled (PLL enable) and may receive an input clock to generate an output clock Fout having a target frequency. As the output clock Fout reaches the target frequency, the clock generator may have a locking state (Lock). In a state where the clock generator is locked, control information Ctrl_J for adjusting a jitter characteristic and a power characteristic of the clock generator may be provided to the clock generator, and based on a value of the control information Ctrl_J, the jitter (Jitter) of the output clock Fout may be adjusted and power (Power) consumed by the clock generator may be adjusted.

For example, the control information Ctrl_J may include digital information having a plurality of bits, and based on values Val_1 to Val_7 of the control information Ctrl_J, a level of a supply current (or an internal current) provided to an oscillation circuit may vary and a capacitance value for adjusting the amount of delay of a delay cell may vary. In FIGS. 9 and 10, an example where, as a value of the control information Ctrl_J varies from Val_1 to Val_7, a resistance value decreases (or power consumption increases), and based thereon, a capacitance value increases, is illustrated.

In adjusting the jitter and power characteristic of the clock generator according to an example embodiment, an enable state (PLL Enable) may be maintained without adjusting the turn-on/off of the clock generator, and moreover, the jitter characteristic and the power characteristic may be adjusted without releasing a locking state. In FIG. 9, an example is illustrated in which, as a value of the control information Ctrl_J is progressively reduced, jitter (Jitter) increases incrementally and power consumption (Power) decreases incrementally. In FIG. 10, an example is illustrated in which, when a requirement for jitter of a digital block provided with the output clock Fout is changed or a digital block provided with the output clock Fout is changed, jitter (Jitter) increases or decreases with time, and correspondingly power (Power) decreases or increases with time.

FIGS. 11A to 11D are circuit diagrams illustrating an operation example which controls various switches of an oscillation circuit on the basis of control information. In FIGS. 11A to 11D, for convenience of description, only a resistor circuit and a delay cell are illustrated. In describing a configuration of each of the resistor circuit and the delay cell each illustrated in FIGS. 11A to 11D, descriptions which are the same as the above-described embodiments are omitted.

Figure 11A:
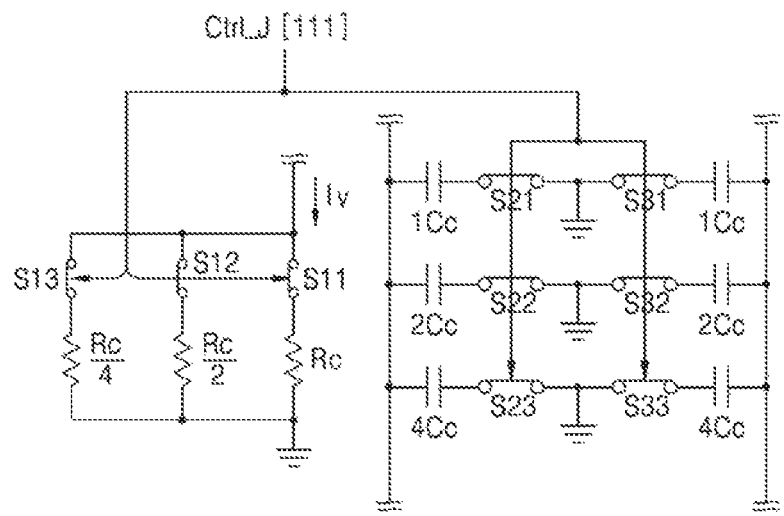
FIGS. 11A to 11D are circuit diagrams illustrating an operation example in which various switches of an oscillation circuit are controlled based on control information, according to an example embodiment.
Figure 11B:
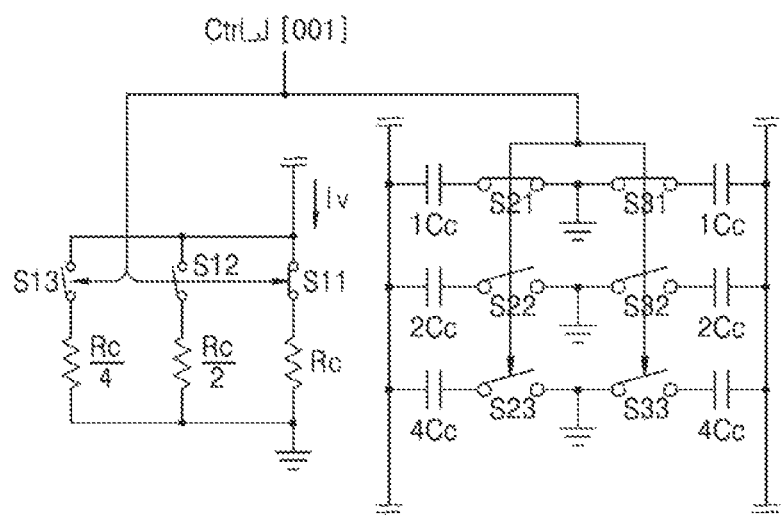

Referring to FIGS. 11A and 11B, first switches S11 to S13 of a resistor circuit and second switches S21 to S23 and S31 to S33 of a capacitor circuit may be controlled in response to 3-bit control information Ctrl_J, and for example, the 3-bit control information Ctrl_J may be provided to the resistor circuit and the delay cell in common. For example, as illustrated in FIG. 11A, in response to the control information Ctrl_J "111", all of the first switches S11 to S13 and the second switches S21 to S23 and S31 to S33 may be turned on and a plurality of resistors Rc, Rc/2, and Rc/4 of the resistor circuit may be electrically connected to one another, and thus, an equivalent resistance value may decrease. Also, a plurality of capacitors 1Cc, 2Cc, and 4Cc of the capacitor circuit may be electrically connected to one another, and thus, a capacitance value may increase. That is, the capacitance value may increase for maintaining a constant frequency on the basis of a reduction in a resistance value.

As illustrated in FIG. 11B, in response to the control information Ctrl_J "001", only the switch S11 of the first switches S11 to S13 may be turned on, and the switches S21 and S31 of the second switches S21 to S23 and S31 to S33 may be turned on. When a connecting state illustrated in FIG. 11A is changed to a connecting state illustrated in FIG. 11B, the number of resistors connected to one another in parallel may decrease and thus an equivalent resistance value may increase, and based thereon, a capacitance value may decrease and thus a frequency may be maintained to be constant and jitter may vary. Similarly, in response to the control information Ctrl_J "011", S11 and S12 of the first switches S11 to S13 may be turned on, and the switches S21, S22, S31, S32 of the second switches S21 to S23 and S31 to S33 may be turned on, and so forth. The correspondence between the bits of the control information Ctrl_J and the switches is only an example, and a different correspondence may be provided. In other words, according to another example, Ctrl_J "100" may correspond to S11, S21 and S31 being turned on, rather than "001" as discussed above.

Figure 11C:
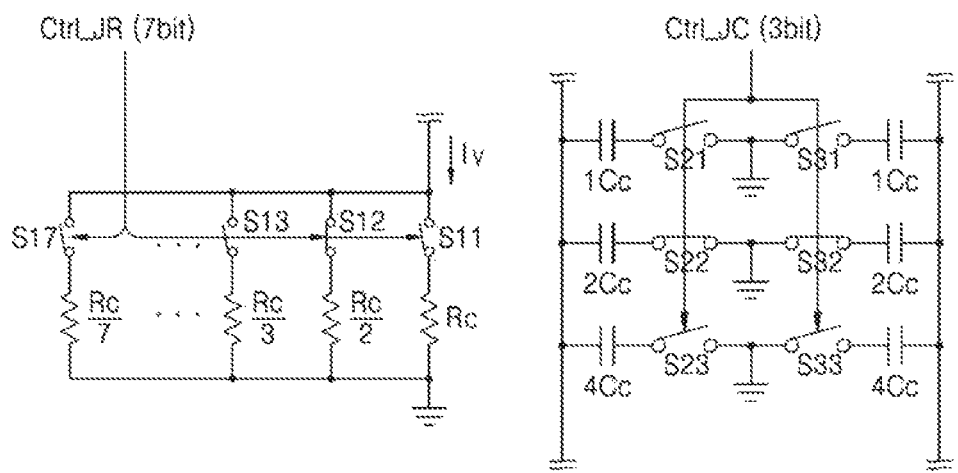
Figure 11D:
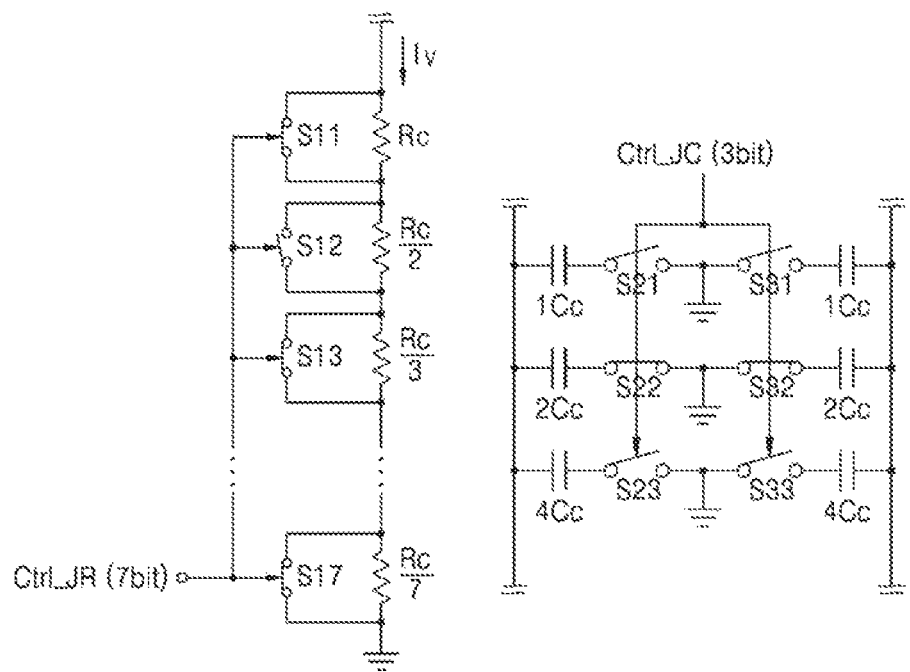

FIGS. 11C and 11D illustrate an example where a resistor circuit and a capacitor circuit of an oscillation circuit are controlled based on different control information.

Referring to FIG. 11C, capacitors of a capacitor circuit may be the same as the elements illustrated in FIGS. 11A and 11B. Therefore, the capacitor circuit may receive 3-bit second control information Ctrl_JC, and a capacitance value of the capacitor circuit may vary within a range from 1Cc to 7Cc on the basis of a connecting state where a plurality of capacitors 1Cc, 2Cc, and 4Cc are connected to a plurality of second switches S21 to S23 and S31 to S33. A resistor circuit may receive multi-bit (for example, 7-bit) first control information Ctrl_JR, and a resistance value of the resistor circuit may vary within a range from Rc to Rc/7 on the basis of a connecting state where a plurality of resistors Rc to RC/7 connected to one another in parallel are connected to a plurality of first switches S11 to S17 disposed based thereon. For example, a switch corresponding to one arbitrary resistor may be selectively turned on based on a capacitance value of the capacitor circuit, and moreover, a value obtained by multiplying the resistance value and the capacitance value may be maintained to be constant. In FIG. 11C, an example where the capacitance value corresponds to 2Cc and only the first switch S12 is selectively turned on in the resistor circuit is illustrated.

FIG. 11D illustrates a case where a plurality of resistors Rc to Rc/7 of a resistor circuit are connected to one another in series, and one of the plurality of resistors Rc to Rc/7 may be selectively applied to a resistance value. For example, when a capacitance value of a capacitor circuit corresponds to 2Cc, only a first switch S12 disposed based on the resistor Rc/2 may be selectively turned off, and the other switches S11 and S13 to S17 may be turned on. In other words, a resistance value may vary through various switching manners, and a value obtained by multiplying a resistance value and a capacitance value may be maintained to be constant.

Embodiments are not limited to the configurations illustrated in FIGS. 11C and 11D, and various modifications of the embodiments are contemplated. That is, jitter and power may be reconfigured by controlling a connecting state where resistors having different sizes and capacitors having different sizes are connected to switches corresponding thereto. The number resistors and capacitors, respectively, may be variously changed, and thus, jitter and power may be reconfigured in more detail, i.e., with finer granularity.

Figure 12:
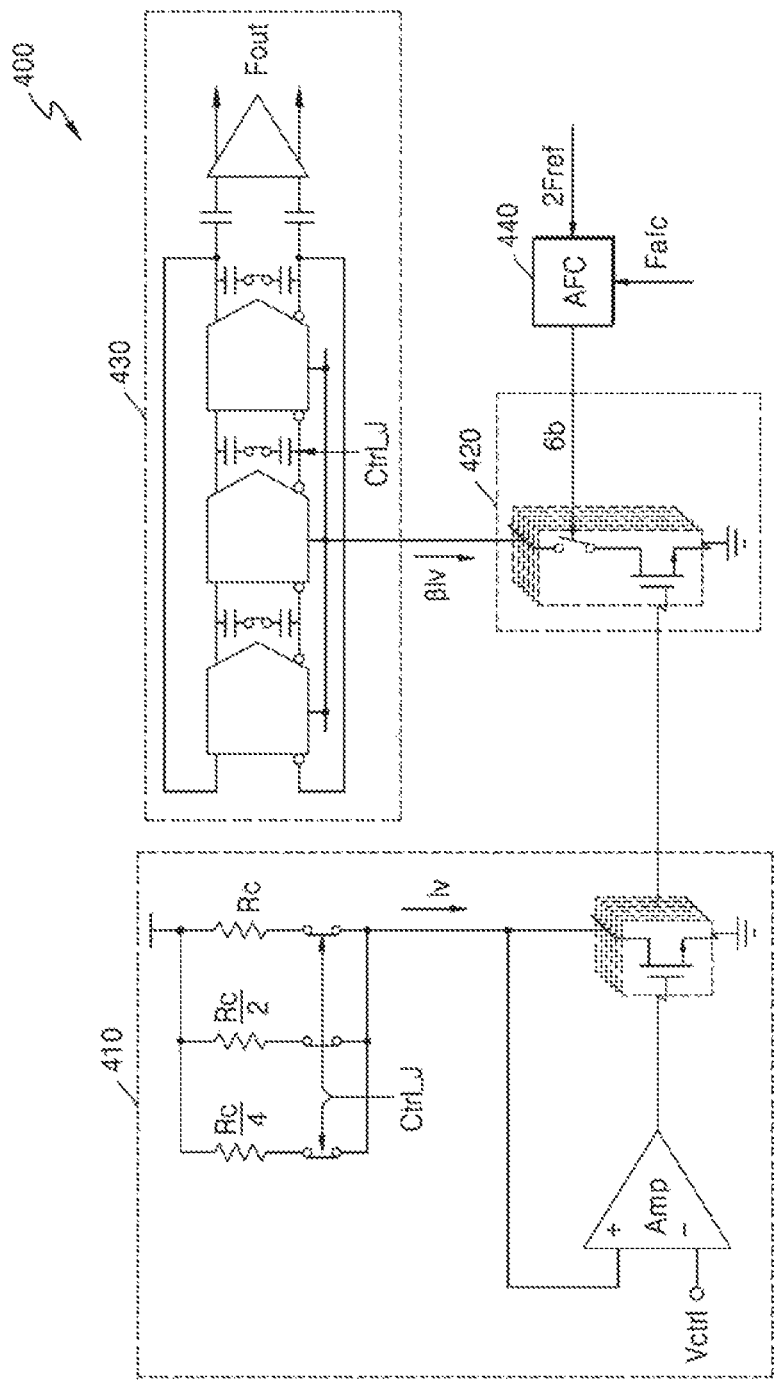
FIG. 12 is a circuit diagram illustrating a clock generator according to an example embodiment.

FIG. 12 is a circuit diagram illustrating a clock generator 400 according to a modified embodiment. In FIG. 12, an implementation example of a VCO included in the clock generator is illustrated.

The clock generator 400 may include a VCO, and the VCO may include a voltage-to-current converter 410, a digital to analog converter (DAC) 420, and an oscillation circuit 430. Identically or similarly to the above-described embodiment, the voltage-to-current converter 410 may include an amplifier, one or more first transistors, and a resistor circuit, and the resistor circuit may include a plurality of resistors Ro, Rc, 2Rc, and 4Rc disposed in parallel and a plurality of switches corresponding thereto. The DAC 420 may include a plurality of first transistors and a plurality of second transistors configuring a current mirror, and the oscillation circuit 430 may include a plurality of delay cells.

In the embodiment of FIG. 12, an example is illustrated in which each of the first transistors and the second transistors is implemented as an N-channel MOS (NMOS) transistor, and thus, the plurality of resistors Ro, Rc, 2Rc, and 4Rc may be disposed in parallel between a source voltage terminal and one node of each of the first transistors. A first current βIv having a level proportional to an internal current Iv may be generated by the DAC 420, and the first current βIv may flow through a path which passes through the oscillation circuit 430, the second transistors, and the source voltage terminal. In the embodiment of FIG. 12, an implementation example of a delay cell is not illustrated, but transistors included in the delay cell may each be implemented as a P-channel MOS (PMOS) transistor, an NMOS transistor, or a combination thereof. That is, the clock generator 400 according to an example embodiment may be designed as various types on the basis of a type of a transistor.

Figure 13:
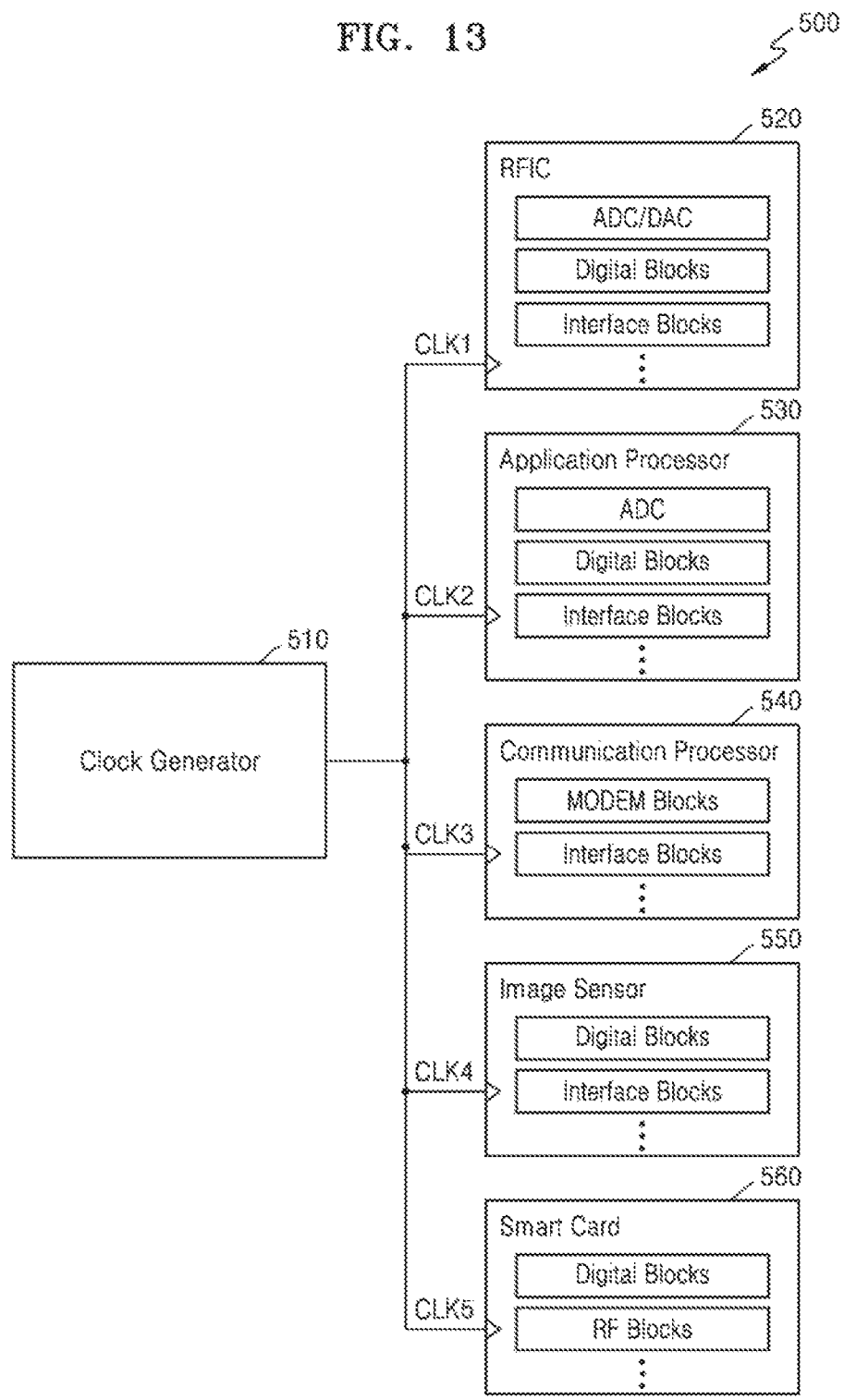
FIG. 13 is a block diagram illustrating a system including a clock generator according to an example embodiment.

FIG. 13 is a block diagram illustrating a system 500 including a clock generator according to an example embodiment.

The system 500 illustrated in FIG. 13 may be one of various kinds of electronic devices. When the system 500 corresponds to a mobile device, the system 500 may be one of various kinds of electronic devices such as mobile phones, smartphones, tablet personal computers (PCs), laptop computers, personal digital assistants (PDAs), portable multimedia players (PMPs), digital cameras, music players, portable game consoles, and navigation systems.

The system 500 may include a clock generator 510 implemented according to the above-described embodiments, and may further include various elements such as a radio frequency integrated circuit (RFIC) 520, an application processor 530, a communication processor 540, an image sensor 550, and a smartcard 560. However, this is merely an embodiment, and the system 500 may include only some of the elements or may further include other elements. In FIG. 13, the clock generator 510 is illustrated as being provided in the above-described elements in common, but based on the elements, the clock generator 510 according to an embodiment may be separately provided. In other words, in some embodiments, the clock generator 510 may provide a clock to only a portion of the various elements 520-560, and a separate clock generator (not shown) may be provided to provide a clock to a remaining portion of the various elements 520-560, etc. According to an embodiment, the clock generator 510 may provide an output clock to one or more elements 520-560. Alternatively, a plurality of the elements 520-560 may time-divisionally use the clock generator 510, and thus, the clock generator 510 may sequentially provide the output clock to the plurality of elements 520-560. As an operation example, an example where first to fifth output clocks CLK1 to CLK5 generated by the clock generator 510 are respectively provided to the RFIC 520, the application processor 530, the communication processor 540, the image sensor 550, and the smartcard 560 is illustrated in FIG. 13.

Each of the RFIC 520, the application processor 530, the communication processor 540, the image sensor 550, and the smartcard 560 may include a plurality of processing blocks for performing signal processing by using a corresponding output clock of the first to fifth output clocks CLK1 to CLK5, and for example, may include an analog-digital converter (ADC), a digital to analog converter (DAC), an interface block, a digital block, a modem block, and a radio frequency (RF) block. Each of the first to fifth output clocks CLK1 to CLK5 may be generated to be optimized for a frequency and jitter characteristic needed for a corresponding element of the RFIC 520, the application processor 530, the communication processor 540, the image sensor 550, and the smartcard 560, and for example, the first clock CLK1 and the second clock CLK2 may have the same frequency and different jitter characteristics. At least one of the first to fifth output clocks CLK1 to CLK5 may have the same frequency but a jitter characteristic which varies with time.

Figure 14:
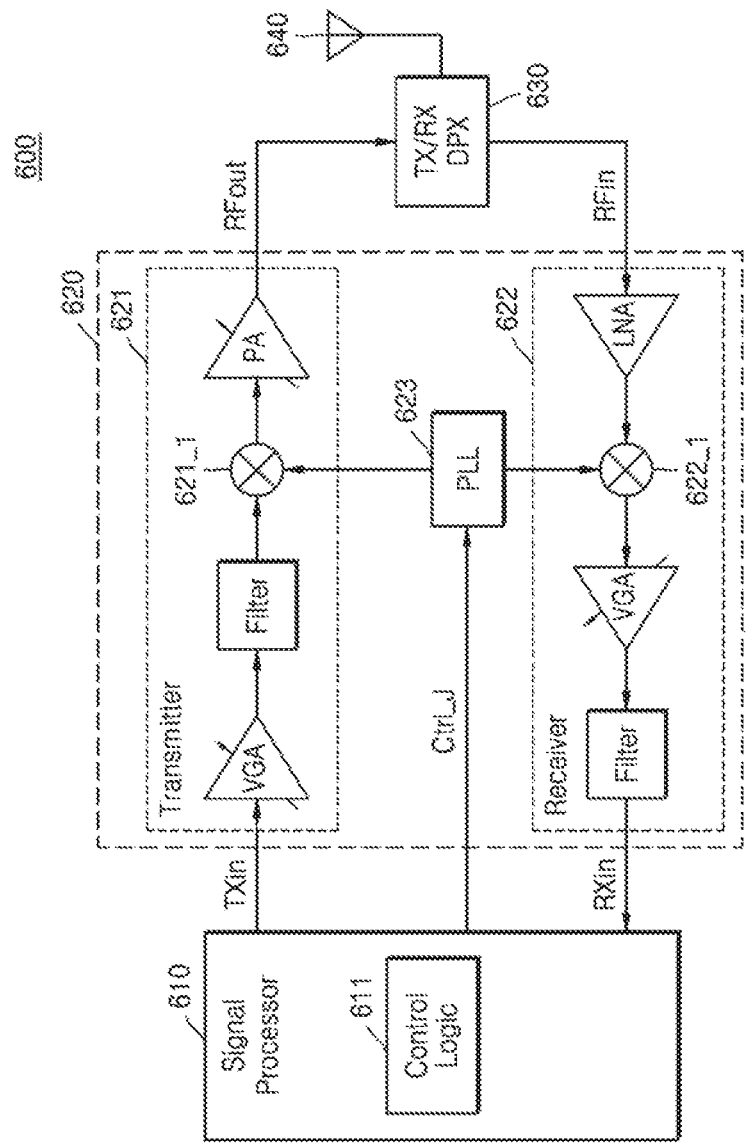
FIG. 14 is a block diagram illustrating a wireless communication device including a clock generator, according to an example embodiment.

FIG. 14 is a block diagram illustrating a wireless communication device 600 including a clock generator according to an example embodiment. The wireless communication device 600 may include an antenna 640 and may transmit or receive a signal through the antenna 640 to communicate with a target device. In a non-limiting embodiment, a wireless communication system used for the wireless communication device 600 to communicate with a target device may be a wireless communication system, using a cellular network, such as a 5th generation (5G) wireless system, an LTE system, an LTE-advanced system, a code division multiple access (CDMA) system, or a global system for mobile communications (GSM) system, or may be a wireless local area network (WLAN) system or another arbitrary wireless communication system.

According to an implementation embodiment, the wireless communication device 600 may include a signal processor 610, a transceiver 620, and a transmission/reception duplexer 630. The transmission/reception duplexer 630 may provide the transceiver 620 with a signal, received through the antenna 640, as an RF input signal RFin and may provide the antenna 640 with an RF output signal RFout received from the transceiver 620.

The signal processor 610 may process a transmission/reception signal of a baseband. According to an implementation embodiment, the signal processor 610 may include a control logic 611, and the control logic 611 may control the transceiver 620. For example, the control logic 611 may output control information Ctrl_J according to the above-described embodiments.

The transceiver 620 may include a transmitter 621, a receiver 622, and a clock generator 623, and a PLL is described as an example of the clock generator 623. The transceiver 621 may process a transmission input signal received from the signal processor 610 to generate the RF output signal RFout. As illustrated, the transmitter 621 may include a variable gain amplifier (VGA), a TX filter, a TX mixer 621_1, and a power amplifier (PA), for processing a transmission input signal TXin. The receiver 622 may process an RF input signal RFin to generate a reception input signal RXin and may provide the reception input signal RXin to the signal processor 610. The receiver 622 may include a low noise amplifier (LNA), an RX mixer 622_1, a VGA, and an RX filter, for processing the RF input signal RFin.

The clock generator 623 may generate an output clock having a frequency for sampling the transmission input signal TXin and the reception input signal RXin and may provide the output clock to the TX mixer 621_1 and the RX mixer 622_1. The clock generator 623 may include the clock generator according to the above-described embodiments and may generate the output clock having a jitter characteristic which is adjusted based on the control information Ctrl_J. In FIG. 14, an example where the control information Ctrl_J is provided from the signal processor 610 is illustrated, but embodiments are not limited thereto. For example, the control information Ctrl_J may be generated in the transceiver 620, or may be generated by another control circuit provided outside the transceiver 620.

Figure 15:
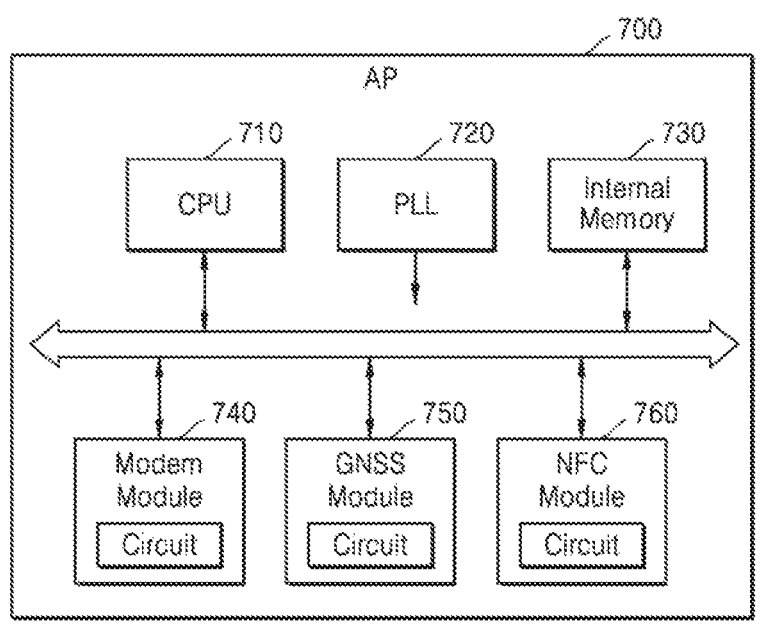
FIG. 15 is a block diagram illustrating an application processor including a clock generator, according to an example embodiment.

FIG. 15 is a block diagram illustrating an application processor (AP) 700 including a clock generator according to an example embodiment. The AP 700 of FIG. 15 may include a modem circuit, and thus, may be referred to as a ModAP.

Referring to FIG. 15, the AP 700 may be implemented as a system on chip (SoC) and may include various kinds of circuit blocks. For example, the AP 700 may include a central processing unit (CPU) 710, a phase-locked loop (PLL) 720, and an internal memory 730. The AP 700 may further include a modem circuit 740 and a global navigation satellite system circuit (GNSS Circuit) 750, and may include a near field communication circuit (NFC Circuit) 760 as an example of a module for performing a different kind of communication. The AP 700 may further include various kinds of communication modules including WLAN and BT, in addition to the elements illustrated in FIG. 15.

The CPU 710 may execute various programs to control a function of the application processor 700. Also, the internal memory 730 may store various programs for controlling an operation of the AP 700, and the programs may be executed by various kinds of processors such as the CPU 710, a processor (not shown) included in the modem circuit 740, and a processor (not shown) included in the GNSS circuit 750.

The PLL 720 may correspond to the clock generator according to the above-described embodiments and may provide an output clock to the modem circuit 740, the GNSS circuit 750, and the NFC circuit 760. For example, according to the above-described embodiments, the PLL 720 may vary the jitter of the output clock by using control information (not shown) for adjusting jitter and power, and the control information may be generated through a control operation of the AP 700. In FIG. 15, one PLL 720 is illustrated as being included in the AP 700, but a plurality of PLLs may be included in the AP 700.

To describe a circuit block (for example, a first circuit block) of one of circuit blocks included in the AP 700 for example, the PLL 720 may provide the first circuit block with the clock signal (or the output clock) having a first jitter characteristic generated based on first power consumption in a first operation mode of the AP 700 or a system including the AP 700. When the first operation mode is changed to a second operation mode, the PLL 720 may provide the first circuit block with the clock signal having a second jitter characteristic generated based on second power consumption without releasing a locking state. In the first operation mode and the second operation mode, a frequency of the clock signal may be maintained to be constant, and when power consumption is relatively large in the first operation mode, the jitter of the clock signal may have a relatively small magnitude.

When the PLL 720 is shared by the first circuit block and a second circuit block, clock signals provided to the first circuit block and the second circuit block may have the same frequency and different jitter characteristics. The PLL 720 may be used by the first circuit block and the second circuit block on the basis of a time division manner, and when a circuit block receiving the clock signal from the PLL 720 is changed from the first circuit block to the second circuit block, the PLL 720 may generate a clock signal having different jitter characteristic without releasing the locking state and may provide the generated clock signal to the second circuit block.

In the clock generator, the semiconductor device including the clock generator, and the operating method of the clock generator according to the embodiments, clock signals having various frequencies may be generated by using a single clock generator, and clock signals optimized for the jitter specification needed for a digital block may be generated, thereby efficiently decreasing power consumption.

Moreover, in the clock generator, the semiconductor device including the clock generator, and the operating method of the clock generator according to the embodiments, jitter characteristic and power consumption may be adjusted without controlling or releasing a turn-on/off operation of the clock generator, and thus, undesired time consumption and power consumption may be reduced.

While the inventive concept has been particularly shown and described with reference to embodiments thereof, it will be understood that various changes in form and details may be made therein without departing from the spirit and scope of the following claims.

What is claimed is:

1. A clock generator comprising:
   a phase detector configured to detect a phase difference between an input clock and a signal obtained by dividing an output clock;
   a voltage generator configured to generate a control voltage having a level based on the phase difference;
   a voltage-to-current converter comprising a resistor circuit comprising a plurality of resistors, the voltage-tocurrent converter being configured to convert the control voltage into an internal current having a level based on a resistance value of the resistor circuit; and an oscillation circuit comprising a capacitor circuit comprising a plurality of capacitors, the oscillation circuit generating the output clock having a frequency based on the level of the internal current and a capacitance value of the capacitor circuit, wherein the clock generator is configured to adjust the resistance value of the resistor circuit based on first control information and the capacitance value of the capacitor circuit based on second control information to maintain a frequency value and vary a jitter characteristic of the output clock.

2. The clock generator of claim 1, wherein the resistor circuit further comprises a plurality of first switches arranged in correspondence with the plurality of resistors, and the capacitor circuit further comprises a plurality of second switches arranged in correspondence with the plurality of capacitors, and as switching of the plurality of first switches is controlled in response to the first control information, the resistance value is set, and as switching of the plurality of second switches is controlled in response to the second control information, the capacitance value is set.

3. The clock generator of claim 2, wherein when the resistance value of the resistor circuit is set to be low, a jitter of the output clock decreases, and when the resistance value of the resistor circuit is set to be high, the jitter of the output clock increases.

4. The clock generator of claim 1, wherein the first control information and the second control information have the same bit value.

5. A clock generator comprising:

a phase detector configured to detect a phase difference between an input clock and a signal obtained by dividing an output clock;

a voltage generator configured to generate a control voltage having a level based on the phase difference;

a voltage-to-current converter comprising a resistor circuit comprising a plurality of resistors, the voltage-to-current converter being configured to convert the control voltage into an internal current having a level based on a resistance value of the resistor circuit, the resistance value being set based on first control information; and an oscillation circuit comprising a capacitor circuit comprising a plurality of capacitors, the oscillation circuit generating the output clock having a frequency based on the level of the internal current and a capacitance value of the capacitor circuit, the capacitance value being set based on second control information;

a digital-to-analog converter connected to an output of the voltage-to-current converter to generate a first current having a level proportional to the internal current from the voltage-to-current converter in response to receiving a control bit, wherein the clock generator is configured to maintain a frequency value and vary a jitter characteristic of the output clock in response to the first control information and the second control information, and wherein the oscillation circuit is configured to receive the first current as a supply current from the digital-to-analog converter.

6. The clock generator of claim 5, further comprising an automatic frequency control (AFC) circuit configured to generate the control bit by monitoring the output clock or by monitoring the signal obtained by dividing the output clock, and to provide the control bit to the digital-to-analog converter.

7. The clock generator of claim 1, further comprising a frequency multiplier configured to receive the input clock and multiply a frequency of the input clock to generate a reference clock, wherein the reference clock from the frequency multiplier is provided as an input of the phase detector.

8. The clock generator of claim 1, wherein the voltage-to-current converter further comprises:

an amplifier comprising a first input terminal connected to the control voltage and a second input terminal connected to an output terminal of the voltage-to-current converter; and one or more first transistors configured to turn on in response to an output of the amplifier to generate the internal current, and wherein the resistor circuit further comprises a plurality of first switches arranged in correspondence with the plurality of resistors, the plurality of first switches connected to one end of each of the one or more first transistors, and controlled to be switched on or off according to the first control information.

9. The clock generator of claim 8, further comprising a digital-to-analog converter comprising one or more second transistors configuring a current mirror along with the one or more first transistors, and one or more second switches respectively corresponding to the one or more second transistors, the digital-to-analog converter outputting, according to switching-on of the one or more second switches, a first current having a level proportional to the internal current.

10. The clock generator of claim 9, wherein the oscillation circuit comprises a plurality of delay cells, each of the plurality of delay cells receiving the first current as a supply current, and each of the plurality of delay cells comprises the capacitor circuit, the capacitor circuit comprises the plurality of capacitors and a plurality of third switches arranged in correspondence with the plurality of capacitors, and switching of the plurality of third switches is controlled in response to the second control information.

11. A semiconductor device comprising:

a clock generator configured to receive an input clock to generate an output clock having a target frequency; and a control logic configured to output control information for controlling a jitter characteristic of the output clock of the clock generator, wherein the clock generator comprises a voltage controlled oscillator configured to generate the output clock having a frequency based on a control voltage generated based on a phase difference between the input clock and a signal obtained by dividing the output clock, and wherein the voltage controlled oscillator is configured to receive the control information and decrease a jitter of the output clock having the target frequency in response to the control information having a first value, and to increase the jitter of the output clock having the target frequency in response to the control information having a second value.

12. The semiconductor device of claim 11, wherein the control logic is configured to provide, in a first mode, the clock generator with the control information having the first value, and to provide, in a second mode, the clock generator with the control information having the second value, and the target frequency is constant in the first mode and the second mode.

13. The semiconductor device of claim 12, wherein the first mode corresponds to a low power mode, the first value has a value for increasing the jitter of the output clock, the second mode corresponds to a high power mode, and the second value has a value for decreasing the jitter of the output clock.

14. The semiconductor device of claim 11, wherein the voltage controlled oscillator comprises:

a voltage-to-current converter comprising a resistor circuit comprising a plurality of resistors, the voltage-to-current converter being configured to convert the control voltage into an internal current and adjust a resistance value of the resistor circuit on the basis of the control information to adjust a level of the internal current; and an oscillation circuit comprising a capacitor circuit comprising a plurality of capacitors, the oscillation circuit being configured to generate the output clock on the basis of a supply current and adjust a capacitance value of the capacitor circuit on the basis of the control information to adjust the frequency of the output clock.

15. The semiconductor device of claim 14, wherein the voltage controlled oscillator further comprises a digital-to-analog converter connected to an output of the voltage-to-current converter to generate a first current having a level proportional to the internal current from the voltage-to-current converter in response to receiving a control bit, and the oscillation circuit is configured to receive the first current as the supply current and generate the output clock having a frequency based on the level of the first current and the capacitance value.

16. The semiconductor device of claim 14, wherein the resistor circuit comprises a plurality of first switches arranged in correspondence with the plurality of resistors, the capacitor circuit comprises a plurality of second switches arranged in correspondence with the plurality of capacitors, and the plurality of first switches and the plurality of second switches are controlled based on the control information.

17. The semiconductor device of claim 16, wherein in response to the control information, when the resistance value of the resistor circuit decreases, the capacitance value of the capacitor circuit increases, and when the resistance value of the resistor circuit decreases, the capacitance value of the capacitor circuit decreases.

* * * * *